(12) United States Patent
Meng

(10) Patent No.: US 7,317,628 B1
(45) Date of Patent: Jan. 8, 2008

(54) MEMORY DEVICE AND SENSE AMPLIFIER CIRCUIT WITH FASTER SENSING SPEED AND IMPROVED INSENSITIVITIES TO FABRICATION PROCESS VARIATIONS

(75) Inventor: Anita X. Meng, Los Altos, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 60 days.

(21) Appl. No.: 11/257,255

(22) Filed: Oct. 24, 2005

(51) Int. Cl.
*G11C 15/00* (2006.01)

(52) U.S. Cl. .................. 365/49; 365/189.09; 365/107; 365/210

(58) Field of Classification Search .................. 365/49, 365/189.09, 205, 207, 210
See application file for complete search history.

(56) References Cited

U.S. PATENT DOCUMENTS 5,428,565 A * 6/1995 Shaw ........................... 365/49

6,744,653 B1 * 6/2004 Huang ........................ 365/49

* cited by examiner

*Primary Examiner*—Son Dinh
(74) *Attorney, Agent, or Firm*—Shemwell Mahamedi LLP

(57) ABSTRACT

A sense amplifier circuit with faster sensing speed and improved insensitivities to fabrication process variations (i.e., eliminated functional failures) is provided herein. According to one embodiment, the sense amplifier circuit associated with a row of memory cells within a memory device may include a charging portion, which is coupled for receiving a reference voltage that is supplied to at least one additional sense amplifier circuit within the memory device. The reference voltage is provided by a current reference generator, which is coupled to the sense amplifier circuit(s) for detecting: (i) a maximum amount of current that can pass through one compare stack within the memory cell array, or (ii) a difference between the maximum amount of current and the current contribution of an n-channel current source within the sense amplifier circuit. A memory device and method of operating one embodiment of the improved sense amplifier circuit are also provided herein.

22 Claims, 19 Drawing Sheets

US 7,317,628 B1

MEMORY DEVICE AND SENSE AMPLIFIER CIRCUIT WITH FASTER SENSING SPEED AND IMPROVED INSENSITIVITIES TO FABRICATION PROCESS VARIATIONS

BACKGROUND OF THE INVENTION

1. Field of the Invention

This invention relates to sense amplifier circuits and, more particularly, to sense amplifier circuits with reduced power consumption, improved insensitivity to wafer process variations and faster sensing speed.

2. Description of the Related Art

The following descriptions and examples are given as background only.

Sense amplifiers are commonly used in memory devices, such as random access memories (RAMs), read only memories (ROMs), and more specialized memories, such as content addressable memories (CAMs).

Continuing goals for nearly all integrated circuits include lower power consumption, higher operating speeds, and lower operating voltages. In the particular case of CAM devices, sensing operations can consume a considerable amount of current (and hence power), as such operations typically involve the continuous charging of multiple match lines, and the subsequent discharging of select match lines. Sense amplifier circuits are usually connected to such match lines to detect a match line state following a compare operation. For some conventional CAMs, a match line representing a match result (i.e., a HIT) will remain charged, while a match line representing a mismatch result (i.e., a MISS) is discharged to (or at least toward) a relatively low voltage power supply (e.g., Vss).

One conventional sense amplifier circuit is disclosed in "A Ternary Addressable Memory (TCAM) Based on 4T Static Storage and Including Current-Race Sensing Scheme," IEEE Journal of Solid-State Circuits, Vol. 38, No. 1, January 2003, pp. 155-158 by Arsovski et al. Another conventional sense amplifier circuit is shown in "A Current-Saving Match-Line Sensing Scheme for Content-Addressable Memories," ISSCC 2003, Session 17, SRAM and DRAM, Paper 17.3 by Arsovski et al, pp. 304-305.

Yet another conventional sense amplifier is shown in FIG. 19. FIG. 19 shows an example of a single-ended sense amplifier employed in a ternary CAM device. In FIG. 19, sense amplifier 1900 is coupled to a compare stack 1902. Compare stack 1902 represents one of many bit compares in a sense operation. For example, bit compares may compare a compare data value (represented by complementary values CD and BCD) to a data value (represented by complementary values D and BD). In some cases, a compare result is maskable by a mask value MASK. Such masking capability is used to form a Mask-Value "ternary" CAM device, as opposed to a binary CAM device.

As shown in FIG. 19, conventional sense amplifier 1900 includes p-channel precharge transistors P1 and P2 having sources commonly connected to a power supply voltage (e.g., VCC), and gates commonly connected to a precharge signal (PRECHG). The conventional sense amplifier 1900 also includes a holding n-channel transistor N1 and sensing n-channel transistor N2. Transistors N1 and N2 may have drains connected to the drains of transistors P1 and P2, respectively. The sources of transistors N1 and N2 can be commonly connected to a match line 1904. The gates of transistors N1 and N2 can be commonly connected to another voltage (VCCQ). The VCCQ voltage may be included to maintain transistors N1 and N2 in an "off" state when match line 1904 is precharged to a high voltage potential, as will be described below.

The drain-drain connection of transistors P2 and N2 are connected to sense node 1906. Sense node 1906 can be precharged to a high precharge voltage (e.g., VCC) by precharge p-channel transistors P2. The potential at sense node 1906 can be buffered by series connected inverters INV1 and INV2 to provide the sense amplifier output signal (SAOUT). If p-channel P4 gate is connected to the bmsa node (which is pre-discharged to VSS since sense node 1906 is pre-charged to high voltage potential), the P4 gate can be (optionally) turned on. P-channel transistors P3 and P4 are arranged in series forming a weak ½ latch between sense node 1906 and supply voltage VCC.

The operation of sense amplifier 1900 will now be described. In a pre-sense period, match line 1904 can be precharged to VCC−Vtn1, where Vtn1 is the threshold voltage of holding transistor N1. It is noted that sensing transistor N2 is designed to have a higher threshold voltage (e.g., at least 200 mV) than holding transistor N1. Thus, once match line 1904 is precharged to VCC−Vtn1, sensing transistor N2 is turned off.

In a sense period, data values (e.g., D and BD) can be compared to compare data (e.g., CD and BCD) within compare stack 1902. If the sense operation indicates a match (e.g., a HIT), all compare stacks (e.g., multiple compare stacks connected to match line 1004) will maintain a relatively high impedance between the match line 1904 and ground (VSS). In this state, sense amplifier 1900 utilizes the difference in threshold voltages of transistors N1 and N2 to keep transistor N2 in the "off" state. With transistor N2 turned off, sense node 1006 can be maintained at the relatively high precharged potential (e.g., VCC). If enabled, the weak ½ latch formed by p-channel devices P3 and P4 will also help to maintain sense node 1906 at its high voltage potential. This enables the sense amplifier output signal (SAOUT) to remain high, indicating a HIT state.

If the sense operation indicates a mismatch (e.g., a MISS), at least one compare stack will provide a relatively low impedance path between the match line 1904 and ground (VSS), causing match line 1904 to be discharged toward ground. When the gate to-source voltage of transistor N2 becomes larger than Vtn2, the sense transistor N2 will turn on. With transistor N2 on, sense node 1906 will discharge through sense transistor N2 and the compare stack 1902 to ground (VSS). This enables the sense amplifier output signal (SAOUT) to transition low, indicating a MISS state.

Thus, sense amplifier 1900 generally operates by pre-charging match line 1904 to VCC−Vtn1, and then discharging the same match line in the event of a MISS state. It is understood that a conventional CAM includes numerous match lines, and in a given sense operation, MISS states are far more common than HIT states. As a result, match operations in conventional sense amplifier circuits tend to consume considerable amounts of current, as match lines are continuously precharged and discharged.

In light of the above, it would be desirable to provide a sense amplifier circuit with lower current consumption than conventional approaches. It would be further desirable to provide a sense amplifier circuit with improved insensitivity to fabrication process variations, as well as faster sensing speed.

SUMMARY OF THE INVENTION

The following description of various embodiments of memory devices, sense amplifier circuits and methods is not to be construed in any way as limiting the subject matter of the appended claims.

According to one embodiment, a memory device and sense amplifier circuit are provided herein. For example, the memory device may include a plurality of memory cells arranged in rows and columns, and a plurality of sense amplifier circuits, each coupled to a different row of memory cells. Unlike other memory devices, a reference generator may be coupled to one or more of the sense amplifier circuits for supplying a reference voltage to a charging portion within each of the one or more sense amplifier circuits. As described in more detail below, the reference voltage may be used to eliminate the occurrence of functional failures by supplying just the right amount of current to a match line of the sense amplifier circuit.

For example, each sense amplifier circuit may be coupled to a match line for receiving a match line voltage and to a low potential line for receiving a low potential voltage from the row of memory cells associated therewith. In addition, each sense amplifier circuit may include: (i) a charging portion, which is coupled between a power supply voltage and the match line, (ii) a discharging portion, which is coupled between the low potential line and a ground supply voltage, and (iii) an n-channel sensing device whose gate is coupled to the match line and whose source is coupled to the low potential line for detecting a potential difference between the match line voltage and the low potential voltage. Furthermore, each memory cell within a given row may include at least one compare stack including a pair of serially-connected n-channel transistors whose drain-to-source path is coupled between the match line and the low potential line.

In order to provide just the right amount of current, the reference generator may include a duplicate compare stack, a duplicate discharging portion and a duplicate n-channel sensing device, each identically formed and coupled in the same manner as the compare stack, discharging portion and n-channel sensing device included within the sense amplifier circuits.

In some cases, the charging portion may include at least two p-channel transistors with source-to-drain paths coupled in series between the power supply voltage and the match line. For example, a first one of the p-channel transistors may be a switch activated by an enable signal supplied to the sense amplifier circuits, and the second one of the p-channel transistors may be a mirror device coupled for receiving the reference voltage from the reference generator. In such a case, the reference generator may be configured for detecting a maximum amount of current that is able to pass through the drain-to-source path of the pair of serially-connected n-channel transistors within the duplicate compare stack, and for generating a proportional reference voltage in response thereto. A p-channel reference device within the reference generator may then be used for supplying the reference voltage to the second p-channel transistor within the charging portion, where it is converted into a current to be supplied to the match line. In this manner, the converted current may be substantially equal to the maximum amount of current detected by the reference generator. This eliminates functional failures by ensuring that the converted current can pass through a single compare stack during a 1-bit MISS condition.

In some cases, the charging portion may further include an n-channel current source and a second p-channel switch, which are coupled in series between the power supply voltage and the match line, and in parallel with the serially-connected first and second p-channel transistors. In such cases, the reference generator may include a duplicate n-channel current source, which is identically formed and coupled in the same manner as the n-channel current source within the charging portion. The reference generator may be configured for detecting the difference between (i) the maximum amount of current that is able to pass through the drain-to-source path of the pair of serially-connected n-channel transistors within the duplicate compare stack and (ii) the amount of current conducted through the duplicate n-channel current source. The difference is mirrored to the second p-channel transistor within the charging portion, where it is converted into a current to be supplied to the match line. In this manner, the converted current may be substantially equal to the difference detected by the reference generator. This also eliminates functional failures by ensuring that the converted current can pass through a single compare stack during a 1-bit MISS condition.

According to another embodiment, a method for operating a sense amplifier circuit is provided herein. For example, the method may include: (i) supplying a first amount of charging current to a match line within the sense amplifier circuit, (ii) detecting a maximum amount of current that can pass through a pair of n-channel transistors coupled in series between the match line and a low potential line within the sense amplifier, and (iii) supplying a second amount of charging current to the match line, so that the combined first and second amounts of charging current substantially equal the maximum amount of current.

In some cases, the step of supplying the first amount of charging current may include activating an n-channel current source, which is included within the sense amplifier circuit and coupled for supplying approximately 60-80% of the maximum amount of current to the match line. Likewise, the step of supplying the second amount of charging current may include supplying a reference voltage to a p-channel mirror device, which is included within the sense amplifier circuit and coupled for supplying approximately 20-40% of the maximum amount of current to the match line. As noted above, reference voltage may be proportional to a difference between (i) the maximum amount of current that can pass through the pair of n-channel transistors and (ii) a maximum amount of current that can pass through the n-channel current source.

BRIEF DESCRIPTION OF THE DRAWINGS

Other objects and advantages of the invention will become apparent upon reading the following detailed description and upon reference to the accompanying drawings in which.

Figure 1:
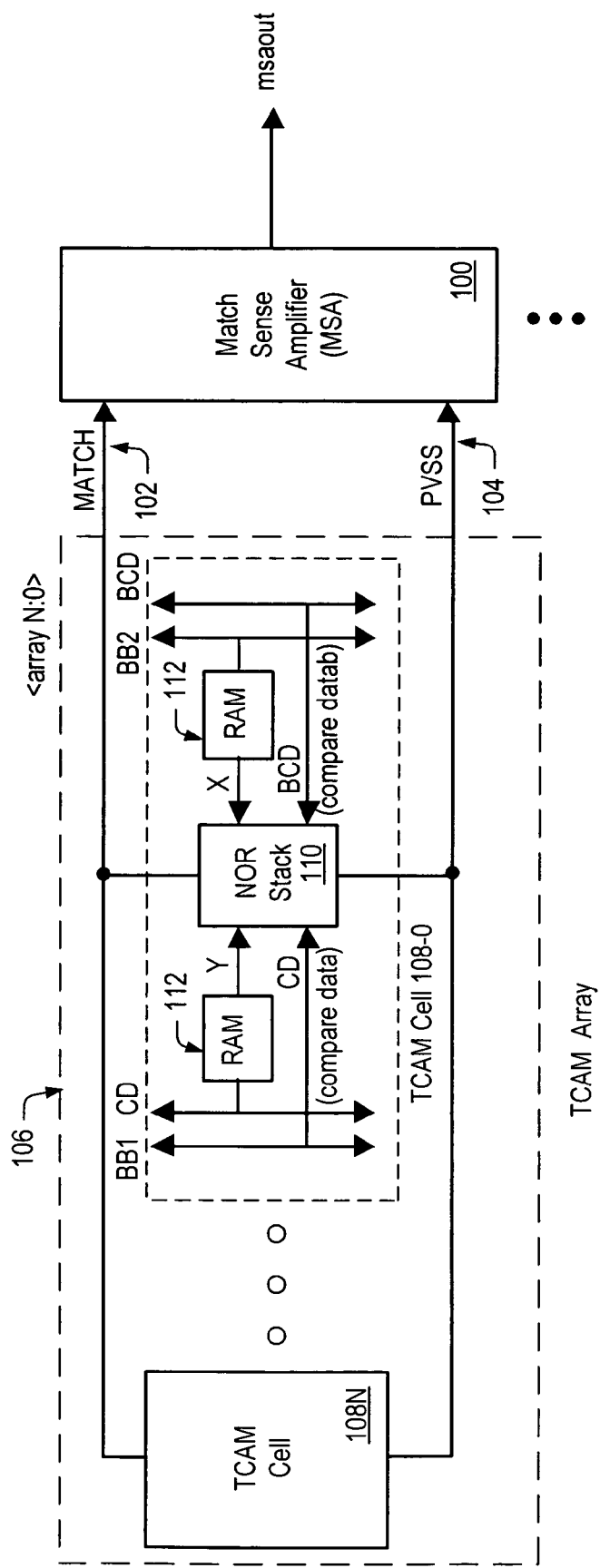
FIG. 1 is a block diagram of a content addressable memory (CAM) device.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

To reduce overall current consumption, a sense amplifier circuit may operate in conjunction with a "pseudo-supply" arrangement. A pseudo-VSS arrangement can include a pseudo-VSS node that is preset (i.e., pre-discharged) to a predetermined value (e.g., VSS). As will be described in more detail below, such an arrangement utilizes a charge sharing mechanism that functions to conserve charge on a match line, thus reducing overall current consumption in the sense amplifier circuit.

Various examples of a content addressable memory (CAM) including a pseudo-VSS arrangement are shown in U.S. Pat. No. 6,515,884 to Sywyk et al. U.S. Pat. No. 6,515,884 shares a common assignee with the present invention and is incorporated herein in its entirety. However, the examples disclosed in U.S. Pat. No. 6,515,884 should not be construed as limiting to the present invention.

FIG. 1 shows a memory architecture including a CAM device and a single-ended sense amplifier with a pseudo-VSS arrangement. As shown in FIG. 1, sense amplifier 100 can receive, as inputs, a match line 102 and a pseudo-VSS line 104. Match line 102 can provide a MATCH signal indicating whether or not an applied compare data value matches a stored data value. Pseudo-VSS line 104 can provide an electrically isolatable potential node—and thus, can be distinguished from a conventional power supply node, such as VSS.

In FIG. 1, match line 102 and pseudo-VSS line 104 are provided by an array of memory cells. In the particular example of FIG. 1, the MATCH and pseudo-VSS (PVSS) signals are provided by an array of content addressable memory (CAM) cells, with each CAM cell being connected to a corresponding match line. Thus, in FIG. 1, CAM array 106 can include a number of CAM cells 108-0 to 108-N. Each CAM cell (108-0 to 108-N) may include a compare stack 110 that can selectively provide a relatively low impedance path between match line 102 and pseudo-VSS line 104 according to match data values and compare data values in the case of "binary" CAM cells, and additionally, according to mask data values in the case of "ternary" CAM (TCAM) cells.

Many varieties of TCAMs exist, such as Mask-Value TCAMs (which usually contain three NMOS transistors in series in a compare stack), X-Y TCAMs (which usually contain two NMOS transistors in series in a compare stack), pseudo ternary TCAMs, etc. The construction of these TCAMs varies but serves the same purpose.

For instance, a Mask-Value Ternary CAM may consist of a data bit, a mask bit, and a compare data bit. In a Mask-Value TCAM, the data bit may come from a RAM, and the mask bit may come from another RAM within a TCAM cell. Another example of a Ternary CAM is the X-Y type, where the encoded X bit is stored within one RAM and the encoded Y bit data is stored within another RAM of the TCAM cell. The ternary bits, in this case, are X data, Y data, and compare data (where content values of the X, Y, and compare data can be "1," "0," or "don't care"). The particular embodiments shown herein use an X-Y type TCAM in the compare stacks; however, one skilled in the art would readily understand how a different type of CAM may be used in alternative embodiments of the invention.

The particular compare stack 110 shown in FIG. 1 is a NOR stack. A NOR stack can include a logic circuit that provides a NOR, or NOR-like function, such as an XNOR type function. Compare stack 110 can receive data values X and Y as inputs, as well as compare data values CD and BCD. Compare data values (CD and BCD) are complementary values that may be supplied to a CAM cell for a compare operation. In some cases, data values (X and Y) may be provided by one or more random access memory (RAM) cells 112. In the case of a ternary CAM device, one RAM cell can provide an X data value while the other RAM cell provides a Y data value. However, in the case of a binary CAM device, only one RAM cell may be included to provide complementary X and Y values. Of course, other storage structures could be used to provide a data and/or mask value, including ROM and other types of storage elements.

Sense amplifier 100 is coupled to match line 102 and pseudo-VSS line 104 for comparing the match line potential to a potential on the pseudo-VSS line, and for generating a match indication (i.e., a HIT) or mismatch indication (i.e., a MISS) in response thereto. For example, sense amplifier 100 may generate a match indication when the match line varies in potential from the pseudo-VSS line. Various examples of sense amplifier circuits with pseudo-VSS arrangements are disclosed in application Ser. No. 10/873,608 entitled "Sense Amplifier Circuit for Content Addressable Memory Device," and in application Ser. No. 10/930,539 entitled "Sense Amplifier Architecture for Content Addressable Memory Device." The above-mentioned patent applications share a common assignee with the present invention and are incorporated herein in their entirety.

Figure 2:
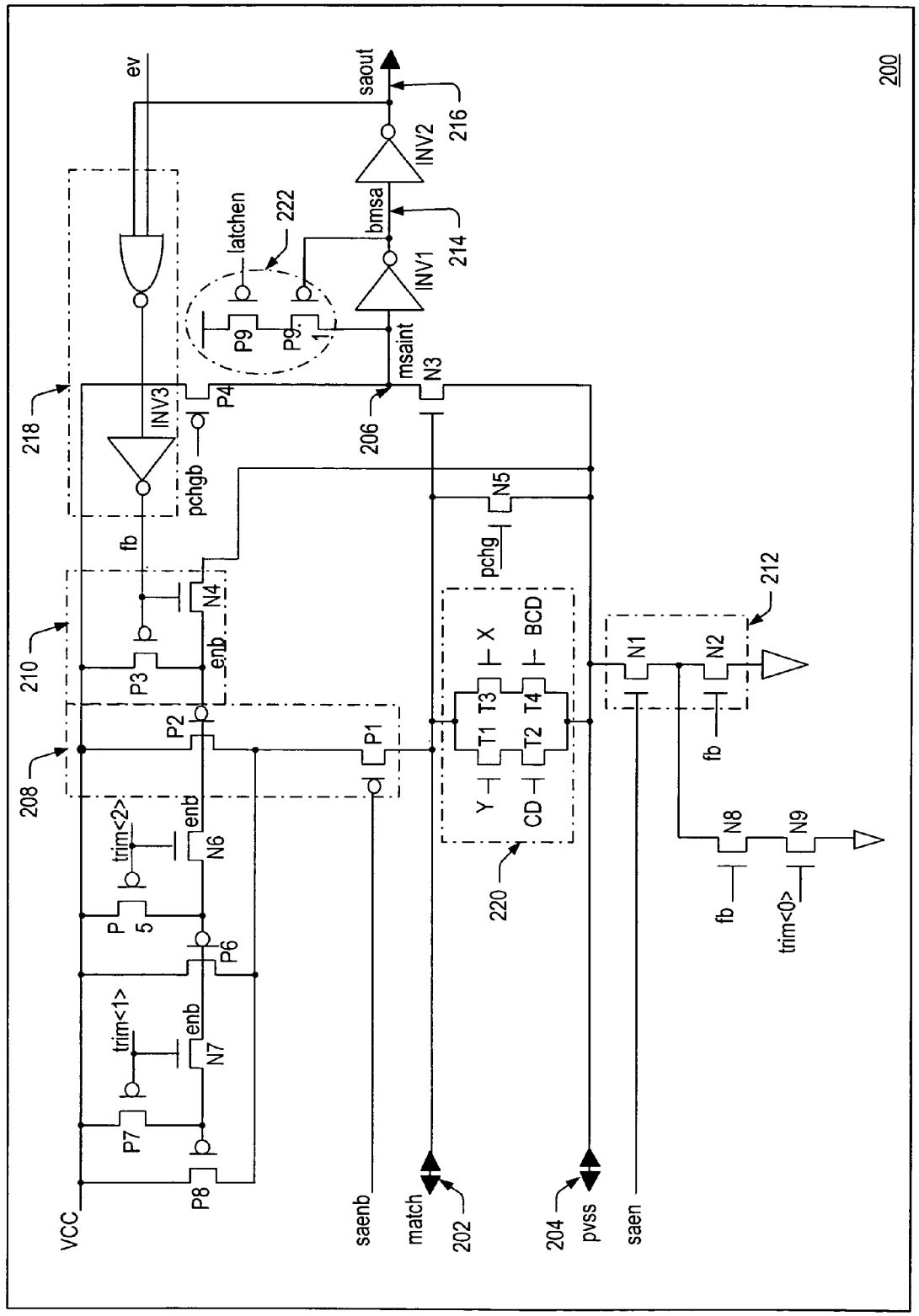
FIG. 2 is a circuit diagram of a sense amplifier circuit with reduced power consumption over conventional sense amplifier circuit designs.

A sense amplifier circuit according to one embodiment is set forth in FIG. 2, and designated by the general reference character 200. In general, sense amplifier 200 may be coupled to at least a portion of a memory array, such as CAM cell portion 220. In the embodiment of FIG. 2, CAM cell portion 220 includes a CAM cell compare stack and is situated between match line 202 and PVSS line 204. It is understood that multiple such compare stacks can be arranged between match line 202 and PVSS line 204. In addition, although a particular compare stack configuration is shown in FIG. 2, other compare stack configurations may be appropriate in other embodiments of the invention.

The particular compare stack shown in FIG. 2 includes transistors T1, T2, T3 and T4. Transistors T1 and T2 have source-drain paths arranged in series with one another between match line 202 and PVSS line 204. Transistors T3 and T4 also have source-drain paths arranged in series with one another, and in parallel with transistors T1 and T2. In the embodiment shown, transistors T1 and T3 receive encoded data values (X and Y) at their respective gates, while the gate terminals of a transistors T2 and T4 receive complementary compare data values (CD and BCD). In some cases, transistors T1, T2, T3 and T4 may be n-channel transistors.

As shown in FIG. 2, sense amplifier 200 may include a charge circuit 208, a feedback circuit 210, a discharge circuit 212, a p-channel pre-charging device P4, an n-channel sensing device N3, and an equalization device N5. In addition, sense amplifier 200 may be generally coupled for receiving a match line 202 and a pseudo-VSS (hereinafter PVSS) line 204 as inputs. As such, sense amplifier 200 may be configured to produce a sense operation result (msaint) at sense node 206, depending on a potential difference between match line 202 and PVSS line 204.

In some cases, sense amplifier 200 may also include two inverters INV1 and INV2, which are arranged in series between sense node 206 and sense amplifier output node 216. In FIG. 2, for example, INV1 is coupled between sense node 206 and intermediate node 214, and thus, is configured for inverting the sense node signal (msaint) to produce intermediate output signal (bmsa). INV2 is coupled for receiving the intermediate output signal (bmsa) and for generating the sense amplifier output signal (saout) at output node 216. As described in more detail below, INV1 and INV2 may be included within the sense amp design to ensure that sense amplifier 200 is preset to a MISS state.

Charge circuit 208 includes a p-channel transistor P2 having a source-drain path arranged in series with another p-channel transistor P1. As shown in FIG. 2, p-channel transistor P1 may receive a sense amplifier enable signal (saenb) at its gate, while the gate of p-channel transistor P2 is connected to an enable node (enb). In this configuration, charge circuit 208 may function to provide a relatively low impedance path between match line 202 and a relatively high power supply voltage (e.g., VCC).

Feedback circuit 210 includes p-channel transistor P3 and n-channel transistor N4. As shown in FIG. 2, p-channel transistor P3 may have a source-drain path connected between the enable node (enb) and the high power supply voltage (e.g., VCC). The gate of transistor P3 is coupled for receiving a feedback signal (fb), which is similar to the output signal (saout). The gate of n-channel transistor N4 is also coupled for receiving the feedback signal (fb). The source-drain path of transistor N4 is coupled between the enable node (enb) and PVSS line 204. In this configuration, feedback circuit 210 may function to disable the charging operation of charge circuit 208 in the event of a match result (i.e., if a "HIT" is detected).

In some cases, feedback control circuit 218 may be included to provide the feedback signal (fb) to feedback transistors P3 and N4, as well as transistor N2 in discharge circuit 212. In one embodiment, feedback control circuit 218 may include a third inverter (INV3) and a NAND gate, whose inputs are coupled for receiving the sense amplifier output signal (saout) and a high voltage signal (ev). As described in more detail below, the feedback signal (fb) may ensure that precharge transistor P2 and discharge transistor N2 are both turned off in the event that a "HIT" is detected. For example, a logic low entry valid signal (ev), indicating that the data is invalid, may cause the feedback signal (fb) to switch off the P2 and N2 current sources. This isolates the match line 202 from the high power supply voltage (e.g., VCC) and PVSS line 204 from the low power supply voltage (e.g., VSS). In addition, feedback control circuit 218 may reduce current consumption by turning off the current paths through charge circuit 208 and discharge circuit 212.

Discharge circuit 212 includes n-channel transistors N1 and N2 having source-drain paths arranged in series between PVSS line 204 and a relatively low power supply voltage (e.g., VSS). As shown in FIG. 2, n-channel transistor N1 may receive a sense amplifier enable signal (saen) at its gate, while the gate of n-channel transistor N2 is coupled for receiving the feedback signal (fb). In this configuration, discharge circuit 212 may function to provide a relatively low impedance path between PVSS line 204 and the low power supply voltage.

In some cases, pre-charging device P4 may include a p-channel transistor with a source-drain path arranged between the high power supply voltage (e.g., VCC) and sense node 206. As shown in FIG. 2, pre-charging device P4 is coupled for receiving a complementary precharge signal (pchgb) at its gate. In response to the precharge signal, pre-charging device P4 may set the sense node (msaint) to a high potential (e.g., VCC), thereby presetting the sense amplifier to a MISS state (logic high, in this case). This is in contrast to conventional approaches that preset the sense node to a HIT state. However, by presetting the sense amplifier to a MISS state, current consumption is decreased in typical applications, where almost all compared words result in a MISS. In other words, almost all sense nodes will remain in the precharge state after sense amp evaluation, and none of the subsequent circuitry (e.g., INV1, INV2) will switch. Current is saved by eliminating the need to continuously charge, discharge and recharge the sense amp when the sense node is preset to the HIT state.

In some cases, sensing device N3 may include a minimum channel length/width n-channel transistor with a gate connected to match line 202, a source connected to PVSS line 204, and a drain connected to sense node 206. Unlike conventional approaches, sensing device N3 is configured for detecting a match (HIT) result, rather than a mismatch (MISS) result. In addition, the sense amplifier design described herein and shown in FIG. 2 improves upon conventional designs by using an n-channel sensing device, rather than a p-channel device. Because the threshold voltage of n-channel devices is typically lower over operating conditions and process variations than p-channel devices, n-channel sensing devices enable faster sensing of a HIT state. As described below, faster sensing allows for faster operation of a CAM device and translates into lower current consumption, due to the advantageous feedback arrangement.

In some cases, equalization device N5 may include an n-channel transistor with a source-drain path arranged between match line 202 and PVSS line 204. The gate of equalization transistor N5 may also be coupled for receiving a precharge signal (pchg). As such, equalization device N5 may be configured for equalizing the potential between match line 202 and PVSS line 204 in response to the precharge signal (pchg). In one example, match line 202 and PVSS line 204 can be equalized to a potential of about ⅓ that of the high power supply (e.g., ⅓ VCC). In other words, when the CAM device operates at a power supply voltage of about 1 V, match line 202 and PVSS line 204 can each be equalized to about 300 mV.

Equalization minimizes power consumption in sense amplifier 200 by saving charge. In the absence of equalization device N5, the match and PVSS lines would be discharged all the way to ground (instead of, e.g., 300 mV). Equalization also improves speed. For example, sense amplifier 200 is configured for detecting a potential difference between the match and PVSS lines. By equalizing to some level above ground, the separation speed between the match and PVSS lines is improved when a HIT occurs (i.e., the PVSS line decreases in voltage potential at the same time that the match line is increasing in voltage potential).

More specifically, the sense amp design described above equalizes the match and PVSS lines to the same voltage potential during the pre-sensing period. During the sensing period, equalization enables the sense amp to detect a relatively larger voltage separation between the match and PVSS lines if there is a "HIT," or a relatively smaller voltage separation if there is a "MISS." A "MISS" occurs when at least one content value in the memory array does not match to the corresponding compare data. For example, a "MISS" occurs when at least one conducting path exists between match line 202 and PVSS line 204 of FIG. 2. Under the "MISS" condition, the separation between the match and PVSS lines should be minimum, so that the sense amplifier will detect a relatively small voltage (or no voltage) separation between the match and PVSS lines. This voltage separation should be small enough, so as not to trip the inverters (INV1 and INV2) in the subsequent stages, allowing the sense amplifier to maintain its pre-charged output in the "MISS" state.

On the other hand, a "HIT" occurs when every content value in the memory array matches the compare data supplied thereto. In the embodiment of FIG. 2, a "HIT" will occur only when there is no conducting path between match line 202 and PVSS line 204. If a relatively large voltage separation between the match and PVSS lines is detected during the sensing period, sense amplifier circuit 200 will switch its output from the pre-charged "MISS" state to a "HIT" state.

Unfortunately, sense amplifier circuit 200 is prone to functional failures, particularly when sensing a 1-bit "MISS" (i.e., a condition that occurs when only one bit mismatch occurs in a given row). For example, even though sensing device N3 may be implemented as a minimum channel length/width device, sensing device N3 may still suffer from an undesirably high leakage current (due to source-drain leakage and the small voltage separation between match and PVSS lines). If too much current is leaked during a 1-bit "MISS," the sense node voltage (msaint) may be reduced to ultimately switch the sense amplifier output signal (saout) from a "MISS" to a "HIT" state, thus causing a functional failure. This is especially likely if the n-channel sensing device (N3) is fast, i.e., where the transistor threshold voltage is less than the nominal Vtn. In some cases, a sensing device N3 with larger channel width and larger channel length may be used to not only reduce leakage, but also to reduce the mismatch among all N3 sensing devices in all match sense amplifiers (MSAs) of a memory array.

In addition or alternatively, an optional "half latch" may be added to sense node 206, in some embodiments of the invention, to keep the sense node at its pre-set high level when sensing a 1-bit "MISS." As shown in FIG. 2, for example, an optional half latch 222 (i.e., a weak half latch) may be added between sense node 206 and intermediate node 214. In one embodiment, half latch 222 may include p-channel transistors P9 and P9.1 having source-drain paths coupled in series between a power supply voltage (e.g., VCC) and sense node 206. The gate of transistor P9 may be coupled for receiving a latch enable signal (latchen), while the gate of transistor P9.1 is connected to intermediate node 214.

Once sense node 206 is pre-set to the logic high value (i.e., a MISS state) during the pre-sensing period, the half latch is turned on to ensure that the sense node signal (msaint) remains at its pre-set level. If a "HIT" is detected during the sensing period, a large voltage separation between the match and PVSS lines will turn on sensing device N3, and the sense node signal (msaint) will be discharged to a logic low level, indicating a "HIT". If one or more bits are mismatched during the sensing period, the sense node signal will remain at the pre-set high level, indicating a "MISS." However, during a 1-bit "MISS," a voltage separation of approximately 200 to 250 mV between match line 202 and PVSS line 204 may cause sensing device N3 to leak. Without the half latch, too much current may leak from sensing device N3, thereby lowering the sense node voltage and unintentionally switching the sense amplifier output state from a "MISS" to a "HIT," causing a functional failure. In some cases, the half latch may help to eliminate functional failures by keeping the sense node at its pre-set high level during a 1-bit "MISS."

Advantages of sense amplifier circuit 200 include, but are not limited to, reduced current consumption and faster sensing speed. For example, sense amplifier circuit 200 reduces current consumption by adopting a charge sharing (or equalization) scheme between the match and PVSS lines. In addition, sense amplifier circuit 200 utilizes a pre-charging device P4 to preset the sense amplifier to a MISS state, rather than a HIT state, thereby reducing current consumption by avoiding the need to continuously charge and discharge the match line. A faster sensing speed is also provided by sense amplifier 200 by using an n-channel, rather than a p-channel, sensing device. In some cases, the improved sensing speed of sense amplifier circuit 200 may enable a memory device, such as a CAM, to operate at substantially higher operating speeds.

However, sense amplifier circuit 200 is not without disadvantages. In some cases, the effective sensing speed and functionality of sense amplifier 200 may be compromised by the above-mentioned equalization scheme and/or by variations in PVT (Process, Voltage, and Temperature). For example, the "HIT" detection speed of sense amplifier 200 is generally limited by the ratio between the maximum current provided by the sense amplifier current source (e.g., charge circuit 208) and the minimum current allowed to pass through one conducting path between the match and PVSS lines. In some cases, the equalization scheme and/or PVT variations may cause some process corners to downbin to lower operating speeds, and may even increase the occurrence of functional failures (such as miss-sensing a 1-bit MISS as a HIT).

To compensate for fabrication process variations, optional trim bits are typically added to sense amplifier 200, as shown in FIG. 2. For example, one or more p-channel current sources (e.g., P5/P6, P7/P8) could be added between VCC and the drain terminal of pre-charge transistor P2. If included, the p-channel current sources may be controlled by one or more trim bits (e.g., trim<2:1>) via one or more n-channel devices (e.g., N6, N7). In some cases, an n-channel current leaker (N8) may also be added between the source of discharge transistor N1 and ground. As shown in FIG. 2, the n-channel current leaker may be controlled by an additional trim bit (e.g., trim <0>) via another n-channel device (N9). All trim bits may be selected for turning on/off the p-channel current source and n-channel current leaker, depending on the electrical parameters of each fabrication lot during wafer testing. If included, the optional trim settings may help to improve sense amplifier performance across all process corners.

For example, the optional trim bits may be used to tune a current source and/or current leaker to improve the effective sensing speed of sense amplifier 200. For a slow PMOS and a fast NMOS process, trim<1> and/or trim<2> may be activated to provide another PMOS current source (e.g., P6 and/or P8), in addition to the default current source (P2) already used to charge the match line. The additional current will help to charge match line 202 at a rate similar to the rate at which the strong NMOS current leaker (N1) discharges the PVSS line. This could enable a faster sensing speed to be obtained without compromising the functionality of a 1-bit "MISS" detection. On the other hand, if the silicon falls into a fast PMOS and slow NMOS process, an additional NMOS current leaker (N8) may be activated to compensate for the slow leaker, which may otherwise cause deficiencies in speed and/or functionality.

Unfortunately, using trim bits to adjust for process variation is a costly back-end testing process. As state-of-art technology advances into the deep submicron range (e.g., within the sub-0.1 µm range), the electrical parameter variations across a wafer, or even a die, may become large. Because of this, it is increasingly difficult to tune a wafer or die with trim bits.

FIGS. 3-18 illustrate exemplary embodiments of an improved sense amplifier circuit that simplifies the back-end testing process by eliminating the need for trim bits. To do so, the various embodiments set forth below utilize a current reference generator to automatically detect the maximum amount of drain-source current (Ids) that can be conducted through one TCAM compare stack (e.g., T1/T2 or T3/T4). Once detected, a reference voltage (Vref) corresponding to the current may be supplied to the charging portions of one or more sense amplifier circuits within the TCAM array. This reference voltage enables the maximum current supplied to the sense amp match lines (Imatch) to be substantially equal to the maximum 1-bit MISS conducting current through any one of the TCAM compare stacks. In other words, a current reference generator is combined with the match line current source (i.e., charge circuit) to ensure that the current source will never provide too much or too little current to the match line. Functional failures (such as miss-sensing a 1-bit MISS as a HIT) are, therefore, eliminated by using the current reference generator to provide just the right amount of current to the match line.

Figure 3:
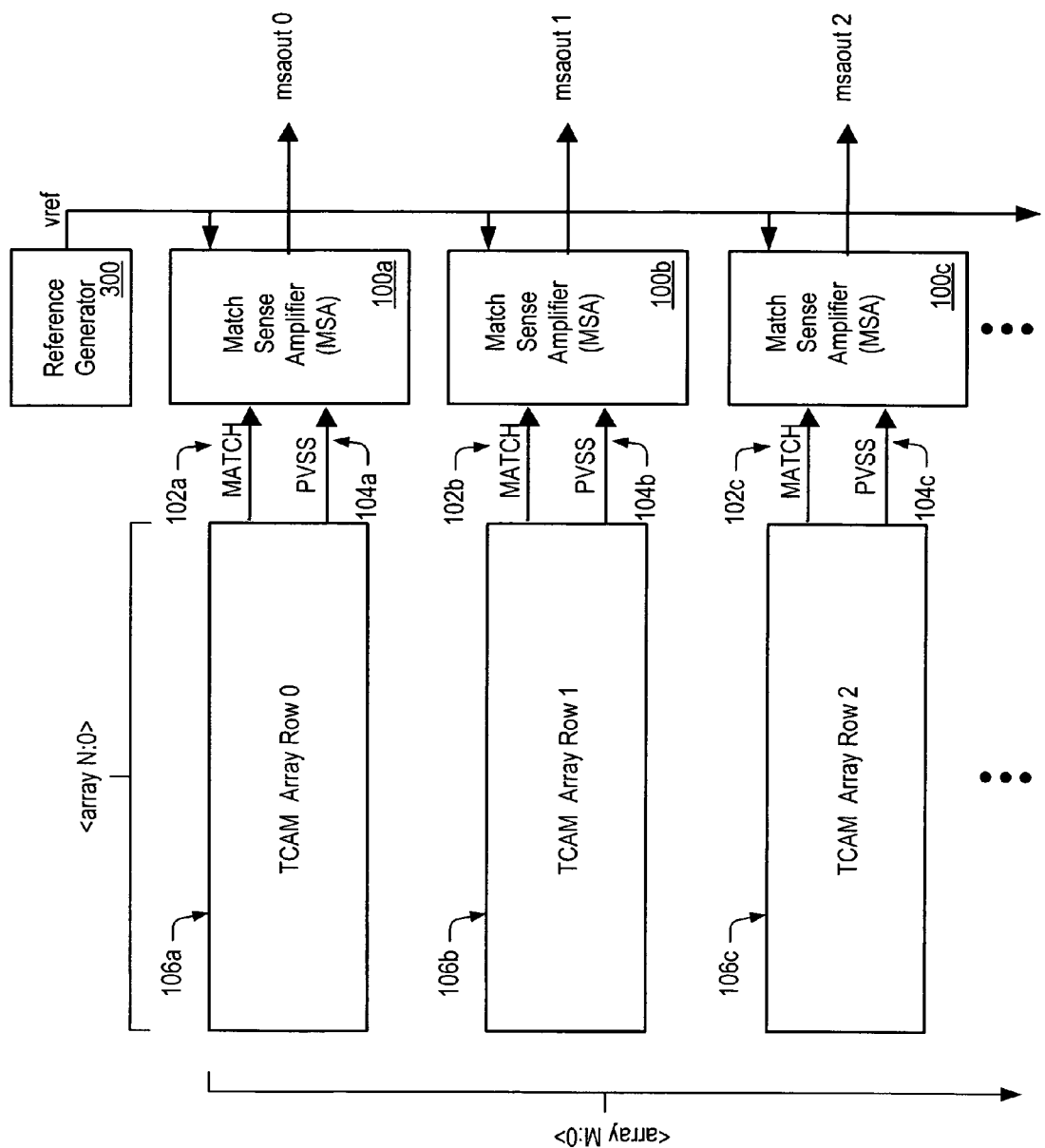
FIG. 3 is a block diagram of a content addressable memory (CAM) device including a memory cell array, a plurality of sense amplifier circuits and one or more current reference generators, according to one embodiment of the invention.

FIG. 3 illustrates one embodiment in which a current reference generator 300 is used to supply a reference voltage (Vref) to a plurality of sense amplifier circuits (e.g., 100a, 100b, 100c, etc.) associated with a plurality of rows (e.g., M-number of rows) within a TCAM array (e.g., 106a, 106b, 106c, etc.). For instance, it is generally well known that same size transistors within a relatively close proximity will have very similar electrical characteristics (e.g., similar Ids and Vt). Because the M-number of TCAM rows (e.g., 32 to 128 rows within a 512 row device) are considered to be a very small sample size, the TCAM compare stack in the reference generator (shown in FIG. 4B) and the TCAM compare stacks in the M-number of TCAM arrays are considered to be very similar electrically. This enables only one reference generator to be used for every M-number of rows in the TCAM array. Due to fabrication process variations, the electrical characteristics of the transistors often vary from location to location across a die. If this occurs, additional reference generators may be utilized to compensate for process variations across the die.

Figure 4A:
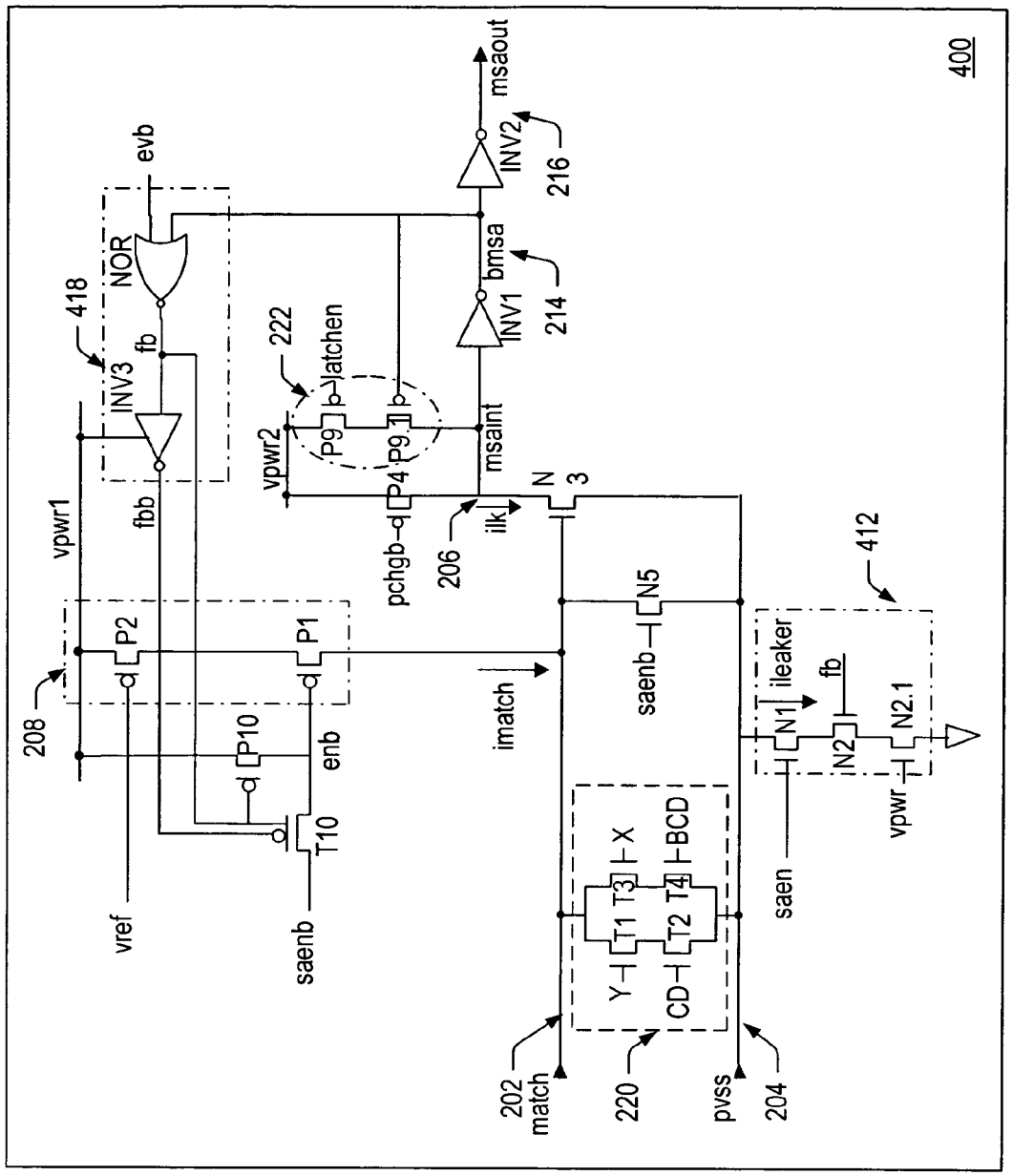
FIG. 4A is a circuit diagram of a sense amplifier circuit coupled for receiving a reference voltage from the reference generator of FIG. 4B, the sense amplifier circuit having reduced power consumption and improved insensitivity to wafer process variations, according to one embodiment of the invention.

FIG. 4A illustrates one embodiment of an improved sense amplifier circuit 400, which eliminates the need for trim bits by utilizing a current reference generator to provide just the right amount of current to match line 202. Many of the circuit elements shown in FIG. 4A are identical to the circuit elements described above in reference to FIG. 2. Like elements are denoted with like reference numerals; the description of which will not be repeated for the purpose of brevity.

Figure 4B:
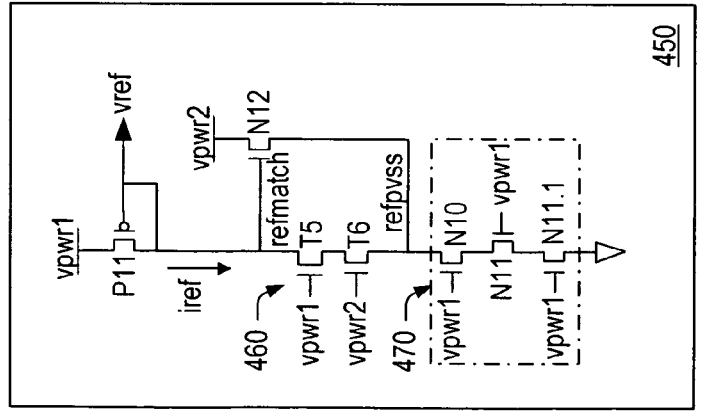
FIG. 4B is a circuit diagram of a reference generator, according to one embodiment of the invention.

In general, sense amplifier circuit 400 differs from sense amplifier circuit 200 by replacing the current source trim bits with a current mirror, which is controlled by a current reference generator, one embodiment of which is shown in FIG. 4B. As noted above, a current reference generator may be provided for every M-number of rows in a TCAM array. The generator is configured to produce a reference current (Iref), which is substantially equal to the drain-source current (Ids) through one compare stack in the TCAM array (e.g., T1/T2 or T3/T4). The reference current can then be mirrored to the charging portions of the plurality of sense amplifier circuits associated with the M-number of rows. This ensures that the same match line current (Imatch) will be generated within each of the sense amplifier circuits. Because Imatch is substantially equal to Iref, the match line current is guaranteed to pass through any one of the TCAM compare stacks, in the case of a 1-bit MISS. Therefore, use of the current reference generator reduces the occurrence of functional failures that may otherwise occur due to fabrication process variations across the die.

As shown in FIG. 4B, current reference generator 450 may include a p-channel reference device (P11), a compare stack 460 (transistors T5/T6), and a discharge circuit 470 (transistors N10, N11 and N11.1), each coupled in series between a power supply voltage (Vpwr1) and ground. Compare stack 460 and discharge circuit 470 are formed similar to the TCAM compare stacks and discharge circuit used in the sense amp design to mimic the conducting current (Iref) through one TCAM compare stack. For example, transistors T5 and T6 of compare stack 460 may be formed substantially identical to transistors T1/T3 and T2/T4, respectively. In addition, transistors T5 and T6 may be driven with different supply voltages (e.g., Vpwr1 and Vpwr2) to mimic the voltage levels supplied to transistors T1/T3 (from the TCAM storage nodes) and the voltage levels supplied to transistors T2/T4 (from the compare data drivers) within the TCAM compare stack 220. The p-channel reference device (P11) is configured for generating a reference voltage (Vref) corresponding to the reference current (Iref) conducted through compare stack 460 and discharge circuit 470.

A sensing device N12 is also included within current reference generator 450 to mimic the leakage current contribution of sensing device N3 (under a 1-bit MISS condition) within the sense amp design. The drain-to-source path of sensing device N12 is coupled between a power supply voltage (e.g., Vpwr2) and the source of compare stack transistor T6, while the gate of sensing device N12 is coupled to the drain of compare stack transistor T5. In order to generate the appropriate amount of reference current (Iref), all transistors (e.g., P11, T5/T6, N10, N11, N11.1 and N12) within current reference generator 450 are substantially equal in size to their counterparts (e.g., P2, T1/T2, N1, N2, N2.1 and N3) within sense amplifier 400.

As shown in FIG. 4A, the reference voltage produced by current reference generator 450 may be supplied to the gate terminal of the p-channel mirror device (P2) within charge circuit 208. In this manner, mirror device P2 may be configured for generating a match line current (Imatch), which is substantially equal to the reference current (Iref), when the p-channel switch (P1) of charge circuit 208 is turned on.

In some cases, a full transmission gate T10 (e.g., a switch formed by p-channel and n-channel transistors) and a weak p-channel P10 pull-up device may be added to turn on/off the p-channel switch (P1) within charge circuit 208. The transmission gate is controlled by the complementary feedback signals (fb, fbb) generated by feedback control circuit 418. As shown in FIG. 4A, transmission gate T10 may have a p-channel source and an n-channel drain coupled for receiving the complementary sense enable signal (seanb), a p-channel drain and an n-channel source coupled to the gate of the switch P1, a p-channel gate coupled for receiving the complementary feedback signal (fbb), and an n-channel gate coupled for receiving the feedback signal (fb). The feedback signal (fb) is also supplied to the gate of pull-up transistor P10, whose a source-drain path is coupled between the power supply voltage (Vpwr1) and the gate of switch P1.

The operation of sense amplifier 400 will now be described. During the pre-sensing period, a complementary sense amplifier enable signal (saenb) transitions from low to high to equalize the match and PVSS lines to a relatively low potential (e.g., ⅓ VCC), and to switch off charging circuit 208 by pulling the gate voltage of switch P1 to a high voltage, while the sense enable signal (saen) transitions from high to low to disable the NMOS current leaker (N1) within the discharge circuit. In addition, a complementary pre-charge signal (pchgb) is supplied to the pre-charging device P4 for charging the sense node (msaint) to relatively high potential (e.g., Vpwr2). Once the sense node is charged, the sense amplifier output signal (msaout) will assume a logic high state (i.e., a MISS state) via inverters INV1 and INV2.

As noted above, the match and PVSS lines may be equalized by turning on equalization transistor N5. In FIG. 4A, the equalization device is enabled by the complementary sense amplifier enable signal (saenb), instead of the precharge signal (pchg) used in the embodiment of FIG. 2. The advantage of replacing the "pchg" signal with the "saenb" signal is that, in either "HIT" or "MISS" case, the sense amplifier enable signals (saen and saenb) will transition to their opposite states (after a required amount of time to detect a "HIT") to save power by turning off charging circuit 208 and discharging circuit 412. For instance, the complementary sense enable signal (saenb) will transition from low to high to turn off charging circuit 208 and at the same time to turn on equalization device N5 which, in turn, will equalize the match and PVSS lines to the same voltage potential. The sensing device N3 will also be turned off due to a 0 v gate-to-source voltage. In the case of a "HIT," the sense node (msaint) will remain at a low voltage potential until a new search cycle starts. In the case of a "MISS" and, especially in the case of a 1-bit "MISS," the 0V gate-to-source voltage of sensing device N3 will ensure that any amount of drain-to-source current leakage is cut off, so that the sense node (msaint) will remain at its preset high voltage potential. Therefore, replacing the "pchg" signal with the "saenb" signal further improves the robustness of the sense amplifier design.

As noted above, feedback circuit 418 generates a pair of complementary feedback signals (fb, fbb). Unlike previous embodiments, the feedback circuit 418 shown in FIG. 4A consists of a 2-input NOR gate and an inverter. The NOR gate inputs are taken from an internal node (bmsa), instead of the output node (saout) used in earlier configurations, and evb (where evb is a complimentary Entry Valid signal, which may be set to a logic low value to enable sense amp operation). During the pre-sensing period, the fbb signal is reset to a logic low level for turning on the p-channel switch in gate T10, while the fb signal is reset to a logic high level for turning on the n-channel switch in gate T10 and the discharging switch device N2. This pulls the enable node (enb) up towards the power supply voltage, turning off the p-channel switch (P1) within charge circuit 208.

During the sensing period, the saenb signal transitions from high to low to turn on p-channel switch P1. The low saenb signal will also function to turn off equalization device N5. At the same time, the saen and pchgb signals each transition from low to high to enable the NMOS current leaker (N1) and disable the pre-charging device (P4), respectively. This enables the match line current (Imatch) to begin charging match line 202.

In the case of a "HIT," the match line voltage rises and PVSS voltage falls due to the absence of a conducting path between the match to PVSS lines. The separation voltage between match and PVSS lines is detected by sensing device N3. Once device N3 turns on, the previously stored (high) charge on the sense node (msaint) will be discharged and the subsequent logic states of INV1 and INV2 will change to output a logic low signal, indicating that a "HIT" has occurred. In the case of a "MISS," one or more conducting paths may exist between the match and PVSS lines. This enables the voltage of the match and PVSS lines to closely track one another at or near the pre-set high level, indicating that a "MISS" has occurred.

A worst case "MISS" detection is observed when only one bit mismatch occurs in a row. For example, the small voltage separation between the corresponding match and PVSS lines may cause sensing device N3 to leak charge (in the sub-threshold region), which may cause the sense amplifier to detect a false "HIT" instead of a 1-bit "MISS." Therefore, a weak half latch (P9 and P9.1) may be included in some embodiments of the invention to provide additional charge at the sense node to compensate for such leakage.

One advantage of sense amplifier circuit 400 is the increased insensitivity to process variations (which eliminates the occurrence of functional failures) without the need for costly back-end trimming processes. Without trim bits, the sense amplifier circuit becomes much simpler, the layout is simplified, die area is reduced, and above all, the manufacture and testing time is greatly reduced (decreased time equals decreased cost). Though the sensing time may be slightly longer in the embodiment of FIG. 4A (due to slow silicon process), there won't be any functional failures.

In addition to the advantages provided above, sense amplifier circuit provides a few other distinctions over the sense amp design of FIG. 2. As noted above, the current leaker (N2) used within the discharge circuit (212) of FIG. 2 may be implemented as a long channel current limiting device whose gate is controlled by the feedback signal (fb). In the embodiment of FIG. 4A, a new circuit scheme splits the current leaker into transistors N2 and N2.1, where N2 is a minimum size transistor and N2.1 is a long channel transistor with large gate area. This alteration reduces capacitive loading on the feedback signal, speeding up the feedback operation to save power.

Another distinction is that sense amplifier circuit 400 may be supplied with one or more relatively high power supply voltages. As shown in FIG. 4A, for example, sense amplifier circuit 400 may be supplied with a first power supply voltage (Vpwr1) and a second power supply voltage (Vpwr2). In one example, Vpwr1 may be a relatively higher supply voltage (e.g., about 1.2 V) and Vpwr2 may be a relatively lower supply voltage (e.g., about 1.0 V). As such, the higher supply voltage may be used in the front-end of the sense amplifier to gain headroom, while the lower supply voltage is used in the back-end to reduce transient current, and hence, reduce power consumption. In other embodiments, however, Vpwr1 and Vpwr2 may be substantially equal.

In addition, the size of transistor P2 can be manipulated, in some embodiments of the invention, to provide a greater or lesser amount of current to match line 202. In one example, the width of mirrored device P2 can be increased by approximately 0% to 20% of the width of the reference device P11 used in the current reference generator (e.g., from 1×-1.2×) to provide up to 20% more current to match line 202. In some processes, for example, the performance of the compare stack may be very good (e.g., the compare stack may demonstrate a small Vt and large Ids). In these processes, the compare stack may be able to handle slightly more charge current without failing to detect a 1-bit MISS. Therefore, the width of transistor P2 may be increased up to 20% to provide up to 20% more current to match line 202. However, the size of transistor P2 is not limited to a 20% increase, and may be increased or decreased by smaller or larger amounts in alternative embodiments of the invention.

Figure 5:
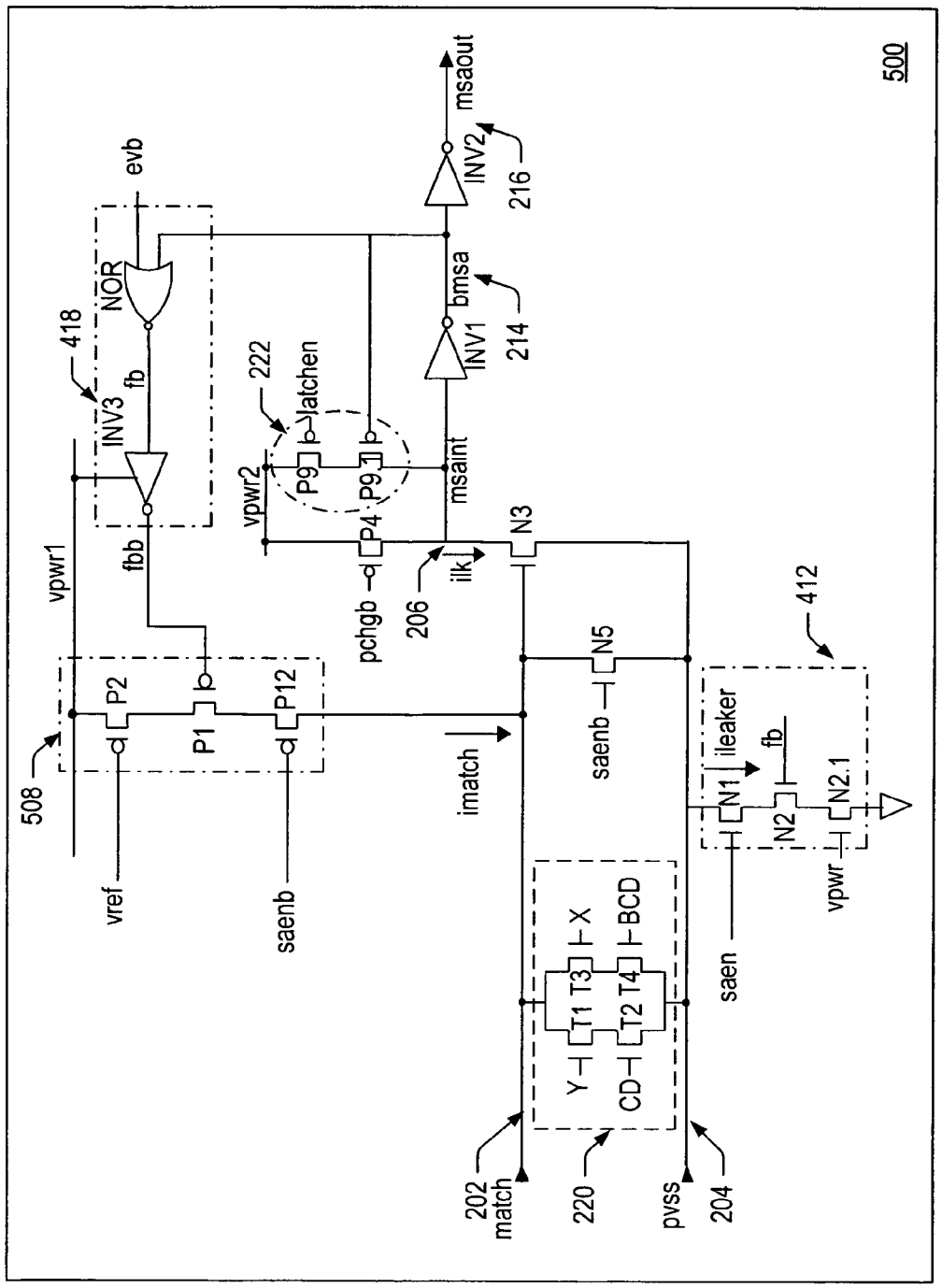
FIG. 5 is a circuit diagram of another sense amplifier circuit, according to a first alternative embodiment of the invention.

FIGS. 5-13 illustrate alternative embodiments of sense amplifier circuit 400. In the embodiment of FIG. 5, the full transmission gate T10 and the P10 device are removed and replaced with p-channel switching device P12 to simplify the control logic and reduce the number of devices in the front-end of the sense amplifier. As such, the configuration shown in FIG. 5 requires less layout area than the embodiment described above. In the current embodiment, charging circuit 508, including p-channel mirror device P2, switching device P1 and switching device P12, is inserted between VCC and match line 202. The gate of mirror device P2 is coupled for receiving the reference voltage (Vref) from current reference generator 450. As shown in FIG. 5, the complementary feedback signal (fbb) is supplied to the gate of switching device P1, while the complementary sense enable signal (saenb) is supplied to the gate of switching device P12. In this embodiment, the current consumption is reduced in feedback control block 218 since the gate loading is reduced. However, placing switch P12 between match line 202 and the drain of switch P1 may reduce current consumption at the expense of headroom.

Figure 6:
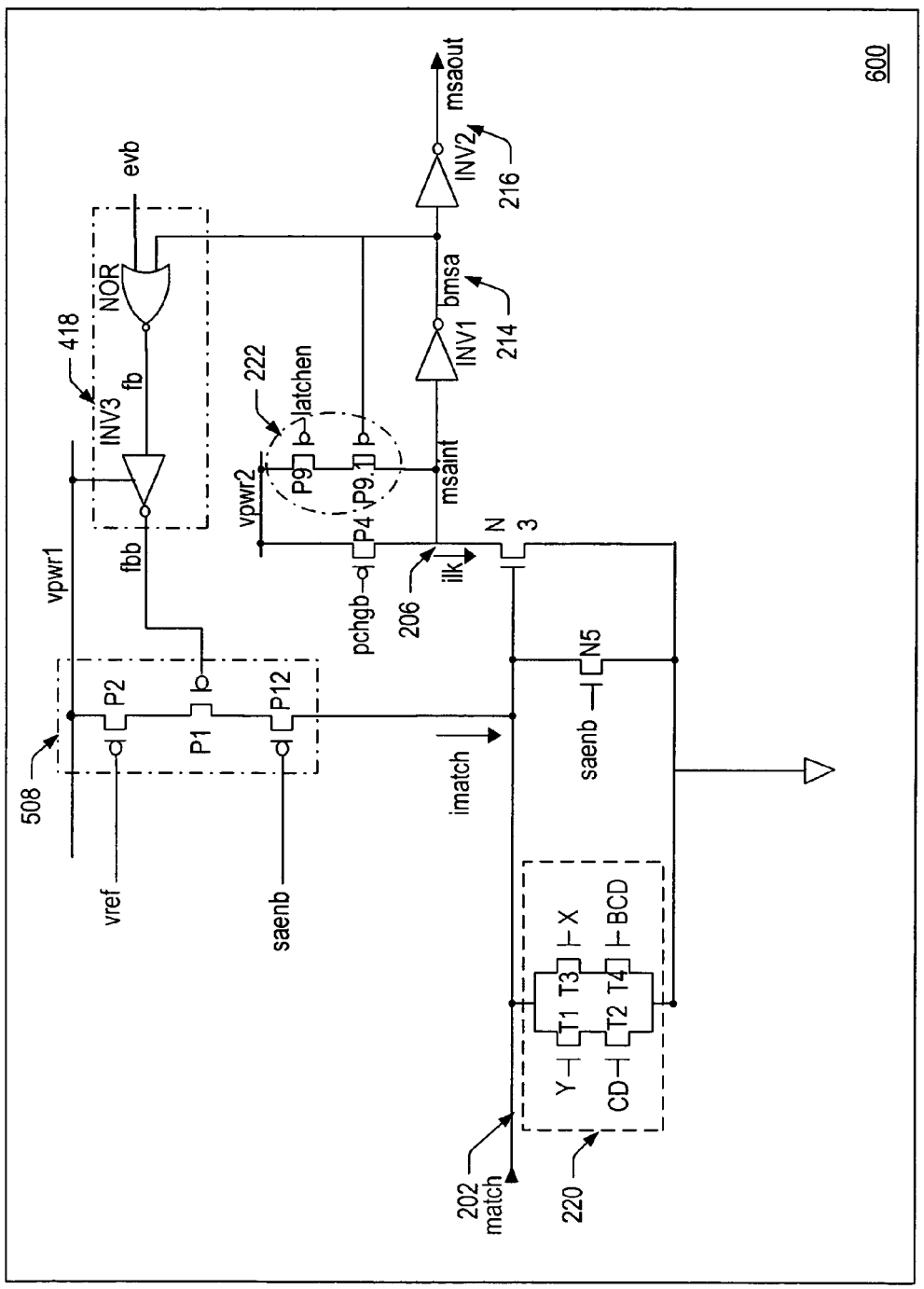
FIG. 6 is a circuit diagram of another sense amplifier circuit, according to a second alternative embodiment of the invention.

In the embodiment of FIG. 6, the discharge circuit is removed and the PVSS line is tied directly to ground in a single-ended sensing scheme. In this configuration, the match line is set to 0V instead of 0.3V (i.e., the equalization voltage between match line 204 and PVSS line 202) during the pre-sensing period. If, during the sensing period, the match line is charged to a value greater than or equal to the gate-to-source voltage (Vgs) of sensing device N3, the charge pre-stored at the sense node (msaint) will be discharged to flip the sense amp output (msaout) from logic high to low, indicating a "HIT." The advantage of this scheme is that it requires smaller headroom. However, the single-ended sensing method of FIG. 6 may be somewhat slower and require more power (since the compare data driver must be driven from 0V to Vpwr1, instead of 0.3V to Vpwr1). In this case, the CD and BCD swing must also be changed to 0V to Vpwr1.

Figure 7:
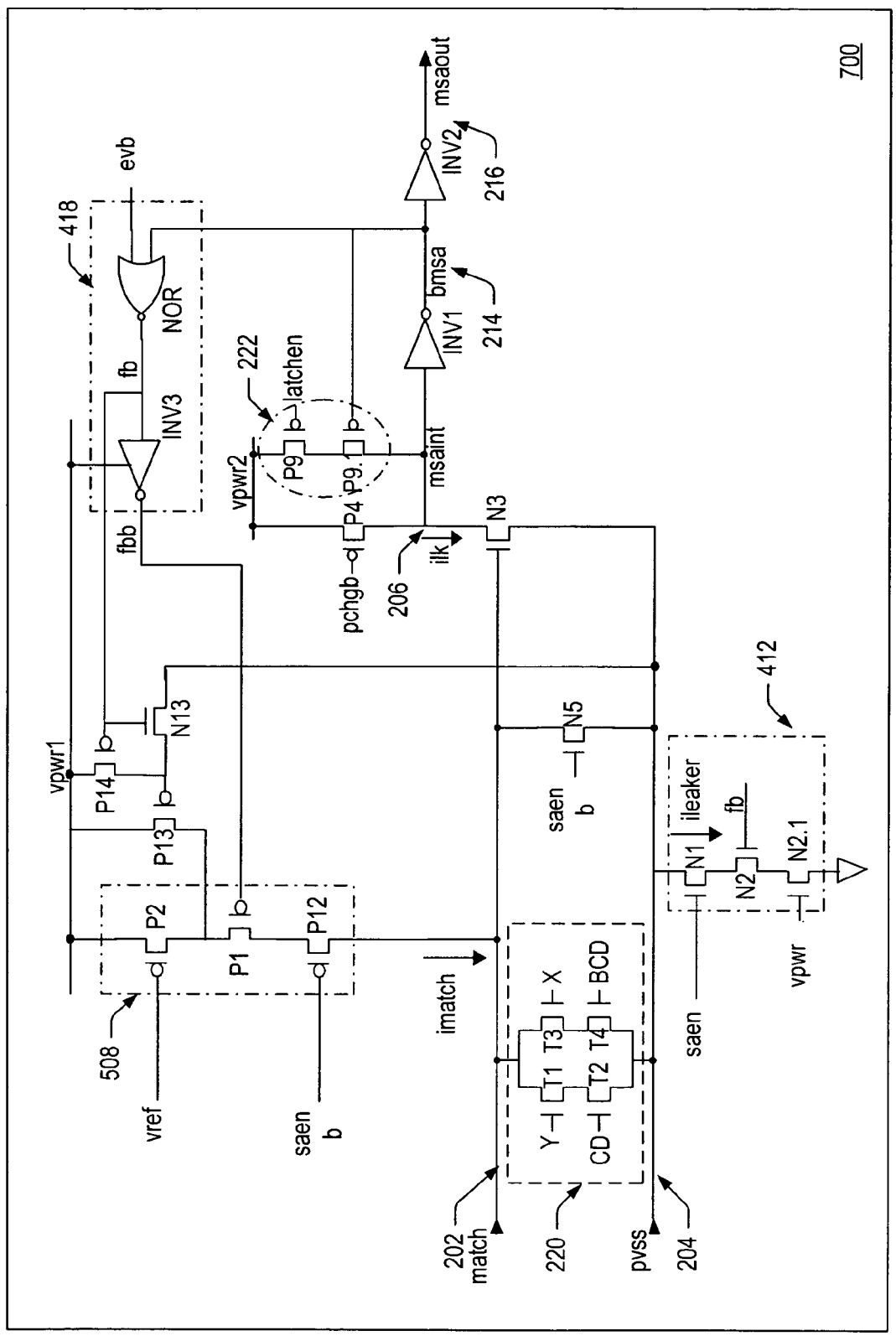
FIG. 7 is a circuit diagram of another sense amplifier circuit, according to a third alternative embodiment of the invention.

In the embodiment of FIG. 7, a dynamically controlled PMOS current source (P13) is added to the sense amplifier design of FIG. 5 to compensate for extra current that may be needed when sensing a "HIT." For example, and as noted above, the match and PVSS lines will pull apart when a "HIT" is detected. As the PVSS line decreases in voltage (e.g., to 150 mV or below), the T2 and/or T4 devices in the TCAM compare stack may begin to leak. To compensate for such leakage, current source P13 is added to provide additional current (Imatch) to match line 202. The positive feedback loop (formed, e.g., by PVSS 204, N13, P13, P1, P12 and match line 202) dynamically controls current source P13 by the voltage present at PVSS line 204. For example, as the PVSS voltage potential decreases, current source P13 will be turned on stronger to supply additional compensation current to the match line. Once a HIT detection is completed, the feedback signal (fb) supplied to p-channel device P14 and n-channel device N13 will turn off current source P13. The feedback control signal will also turn off the charging circuit 508 and discharging circuit 412.

Figure 8:
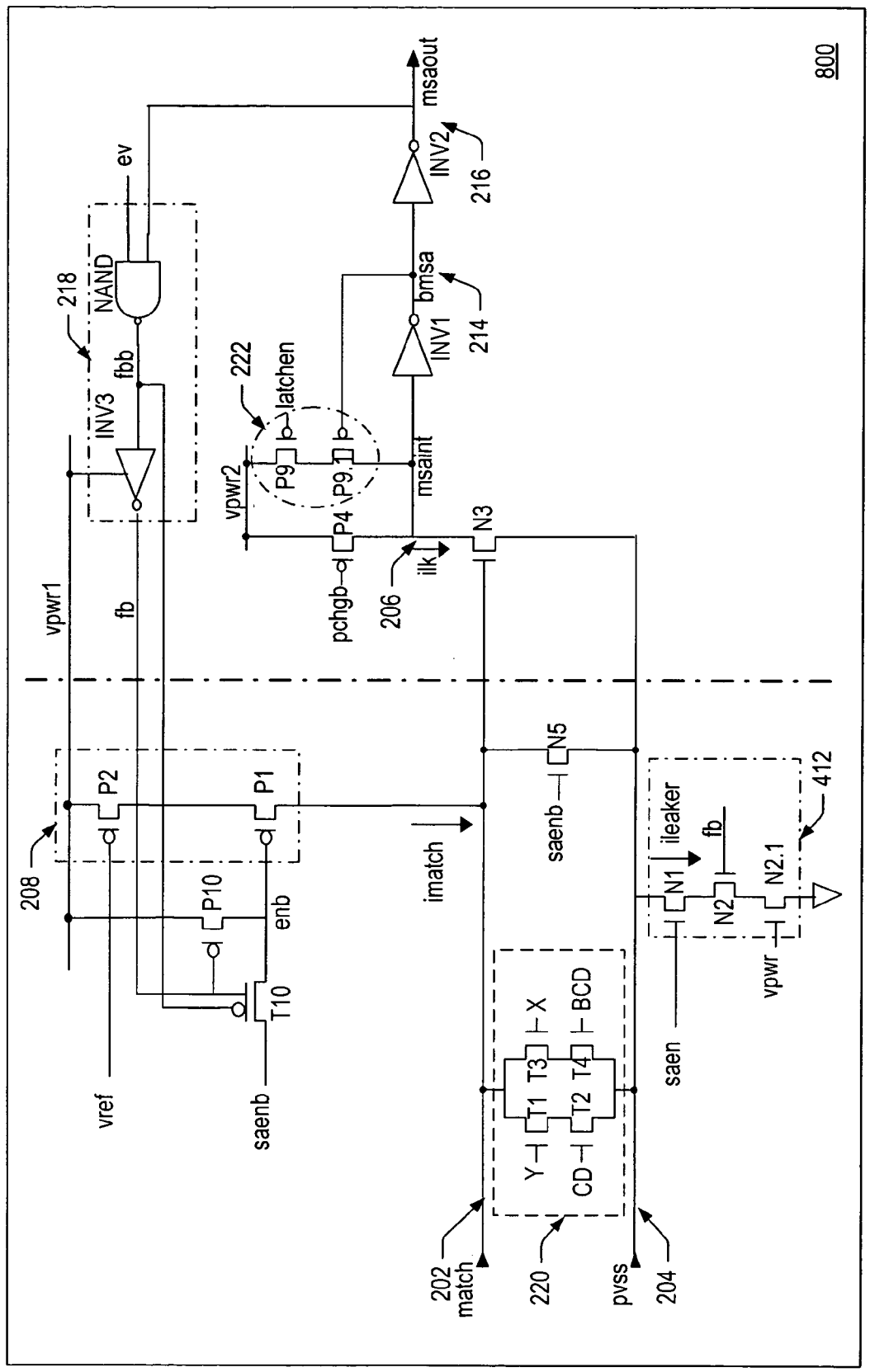
FIG. 8 is a circuit diagram of another sense amplifier circuit, according to a fourth alternative embodiment of the invention.

In the embodiment of FIG. 8, the NOR gate used in feedback control circuit 418 is replaced with the NAND and INV3 gates used in feedback control circuit 218. The INV3 gate serves, not only as a logic function, but also as a level shifter when Vpwr1>Vpwr2. For example, the INV3 gate may select a higher PMOS threshold voltage (e.g., Vtp=0.6V, instead of Vtn=0.3V) when the voltage difference between Vpwr1 and Vpwr2 is less than about 0.3V. The INV3 device is able to accept an input signal which swings between 0 v and Vpwr2 (e.g. 1 v) and is able to provide an output (e.g. fb) that swings from 0 v to Vpwr1 (e.g. 1.2 v) without compromising its logic function or sacrificing leakage current through the source/drain path of the PMOS and NMOS devices in INV3. This enables the control signals and feedback signal (e.g. fb) in the front-end of the sense amplifier to be at the same voltage level, even when Vpwr1 is not equal to Vpwr2. As such, the embodiment shown in FIG. 8 may be used to avoid source-drain leakage caused by power supply variations. However, since the NAND gate uses Vpwr2, its output (fbb) will swing between 0V and Vpwr2. So depending on p-channel transistor characteristics, it might be a good idea to use a higher threshold voltage p-channel device in transmission gate T10.

Figure 9:
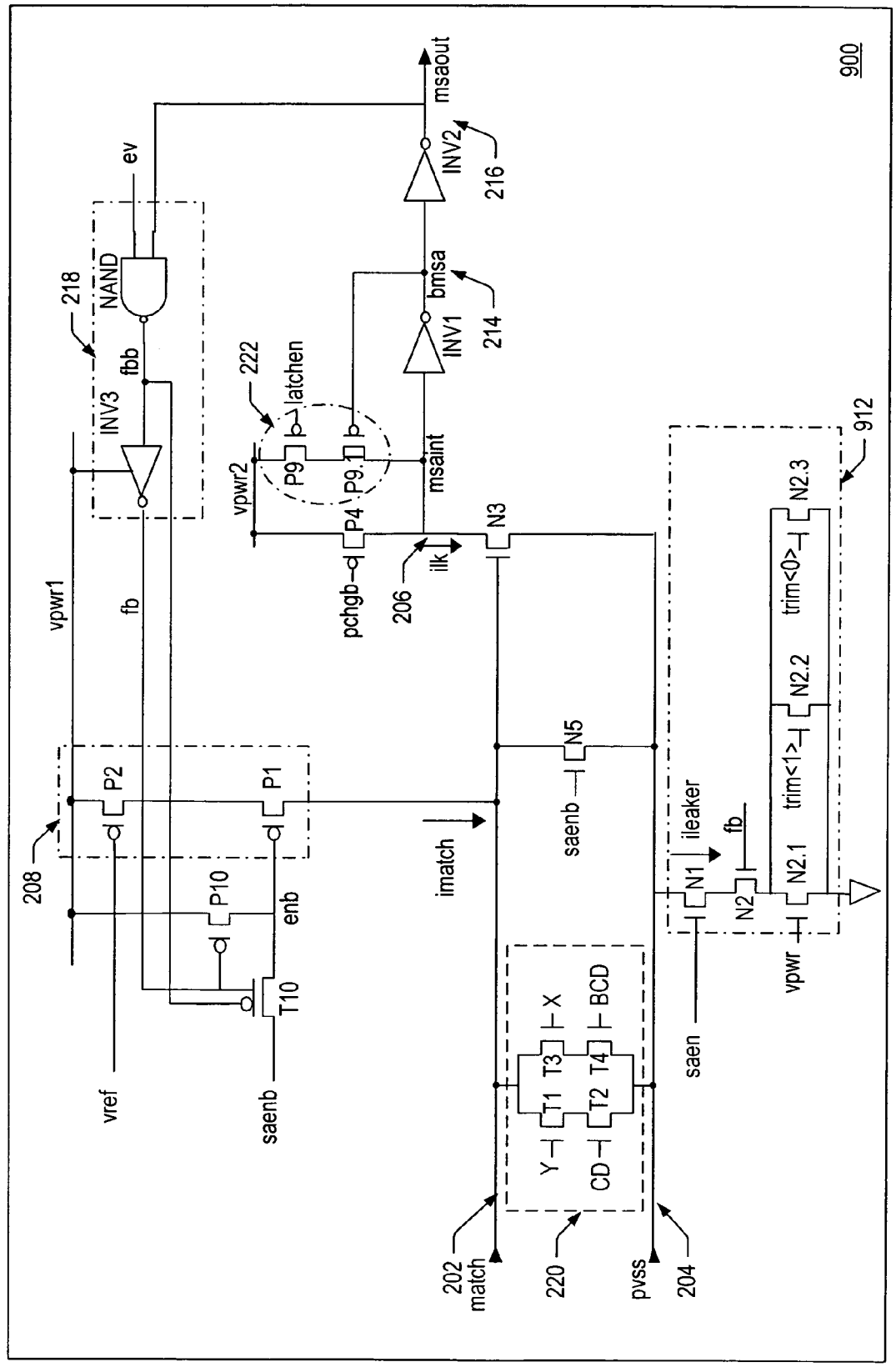
FIG. 9 is a circuit diagram of another sense amplifier circuit, according to a fifth alternative embodiment of the invention.

In the embodiment of FIG. 9, two trim bits (trim <1:0>) are added to the discharge circuit of FIGS. 4-8 to produce discharge circuit 912. This enables the match line and PVSS line to be biased at different voltage levels based on certain process variations. For instance, at slow NMOS process corners, one or two trim bits may be used to select additional leaker devices (e.g., N2.1 and N2.2 if trim<1> is enabled, or N2.1, N2.2 and N2.3 if trim<1:0> are enabled), thereby maintaining or even lowering the match/PVSS equalization point to obtain faster operating speed. The advantage of this configuration is that it may be used to improve sensing speed over some process corners.

Figure 10:
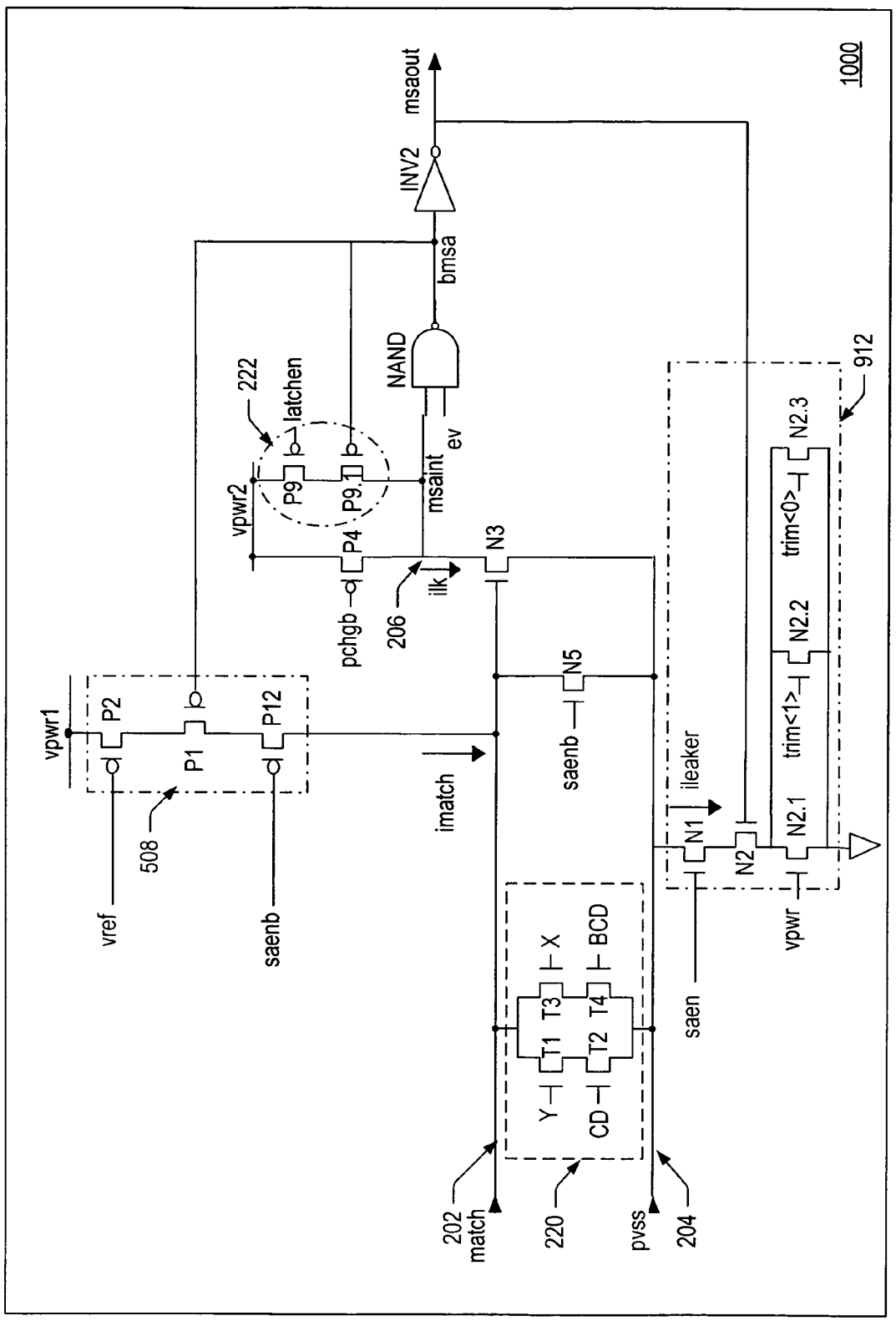
FIG. 10 is a circuit diagram of another sense amplifier circuit, according to a sixth alternative embodiment of the invention.

In the embodiment of FIG. 10, the charging circuit 508 introduced in FIG. 5 (i.e., mirror device P2 serially coupled with switching devices P1 and P12) is used with a feed forward architecture. In the feed forward architecture, INV1 is replaced by a NAND gate whose inputs are coupled to the sense node (msaint) and the entry valid (ev) control signal. The output of the NAND gate (bmsa) is supplied to INV2, latch transistor P9.1 and the gate of switching device P1. The sense amplifier output signal (msaout) serves as the feedback control signal for the N2 switch within discharge circuit 912. In this configuration, power consumption is reduced (by removing the logic gates originally included within feedback paths 218 and 418) at the cost of sensing speed. In some cases, the lower sensing speed of sense amplifier circuit 1000 may be compensated by increasing the Iref:Imatch current ratio from 1:1 to about 1:1.25. In some cases, it may be beneficial to set Vpwr1=Vpwr2 when utilizing the feed forward configuration, due to the difficulty in managing the feedback lines when the power supply voltages supplied to the front- and back-ends of the circuit are different.

Figure 11:
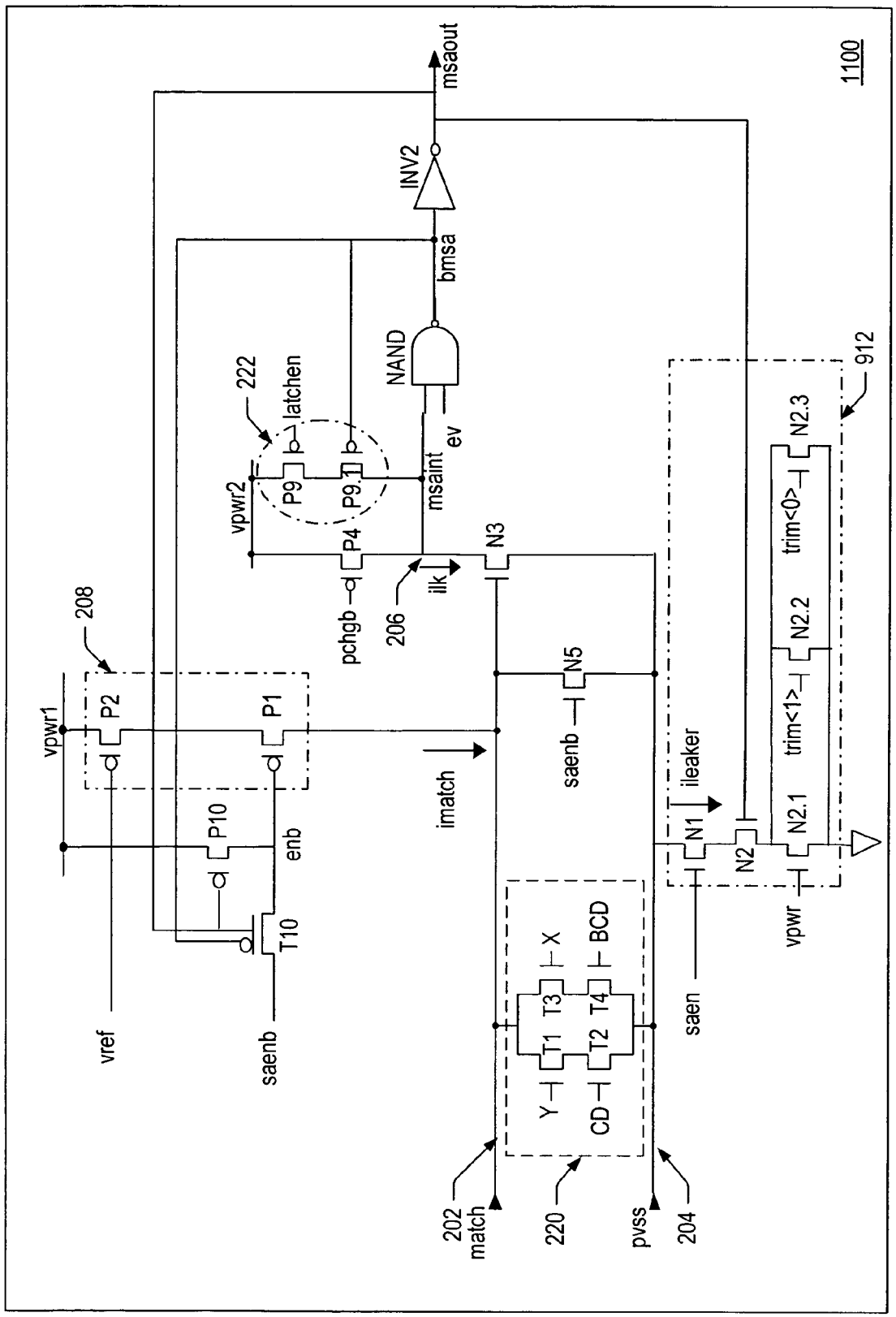
FIG. 11 is a circuit diagram of another sense amplifier circuit, according to a seventh alternative embodiment of the invention.

In the embodiment of FIG. 11, the feed forward architecture described above is applied to the sense amp circuit shown in FIG. 9. In this configuration, the output of the NAND gate (bmsa) is supplied to INV2, latch transistor P9.1 and the p-channel gate of transmission gate T10. In addition to the N2 switch within discharge circuit 912, the sense amplifier output signal (msaout) is supplied to the gate terminals of n-channel of transmission gate T10 and p-channel device P10 as a feedback control signal. In this configuration, the current consumption is reduced (e.g., by elimination of feedback circuit of 218 or 418) and the match line slew rate during "HIT" sensing is improved at the cost of slower sensing speed (due to heavier loading at the bmsa and msaout nodes).

Figure 12:
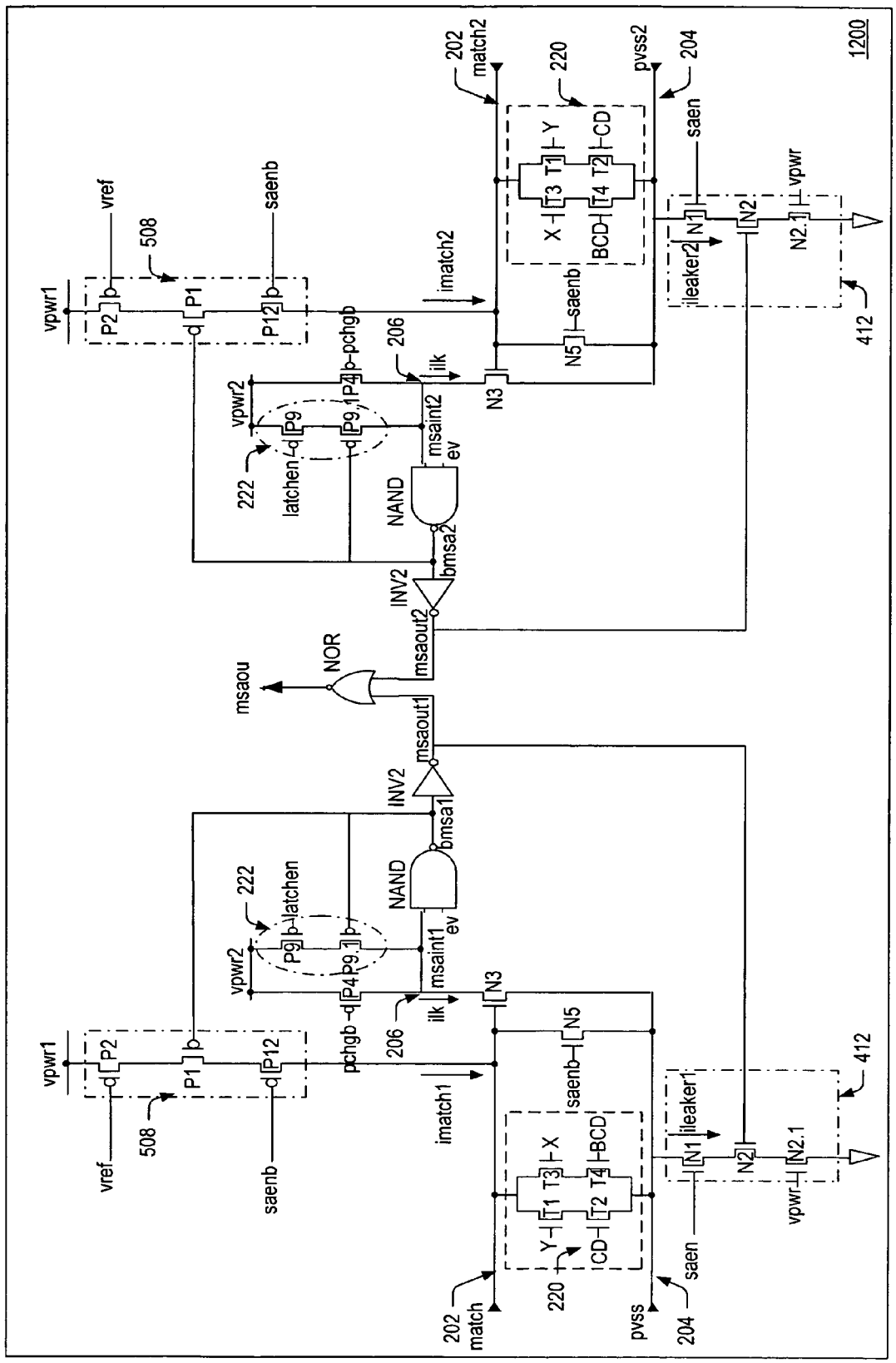
FIG. 12 is a circuit diagram of another sense amplifier circuit, according to an eighth alternative embodiment of the invention.

In the embodiment of FIG. 12, the sense amp circuit shown in FIG. 10 (without trim bits in the discharge circuit) is duplicated to implement a feed forward architecture with ½ row detection capabilities. As in FIG. 10, the feed forward signals bmsa and msaout serve as the feedback control signals to turn on/off the sense amp current source (i.e., charge circuit 508) and current leaker (i.e., discharge circuit 412), respectively. An additional NOR gate is used to combine the two sense amp outputs (msaout1 and msaout2). As one advantage, the ½ row architecture shown in FIG. 12 greatly increases sensing speed by reducing match and PVSS line capacitance. Although the feed forward architecture shown in FIGS. 10-12 tends to reduce current consumption, the overall power consumed in the embodiment of FIG. 12 is increased due to the use of two sense amp circuits in every row instead of one.

Figure 13:
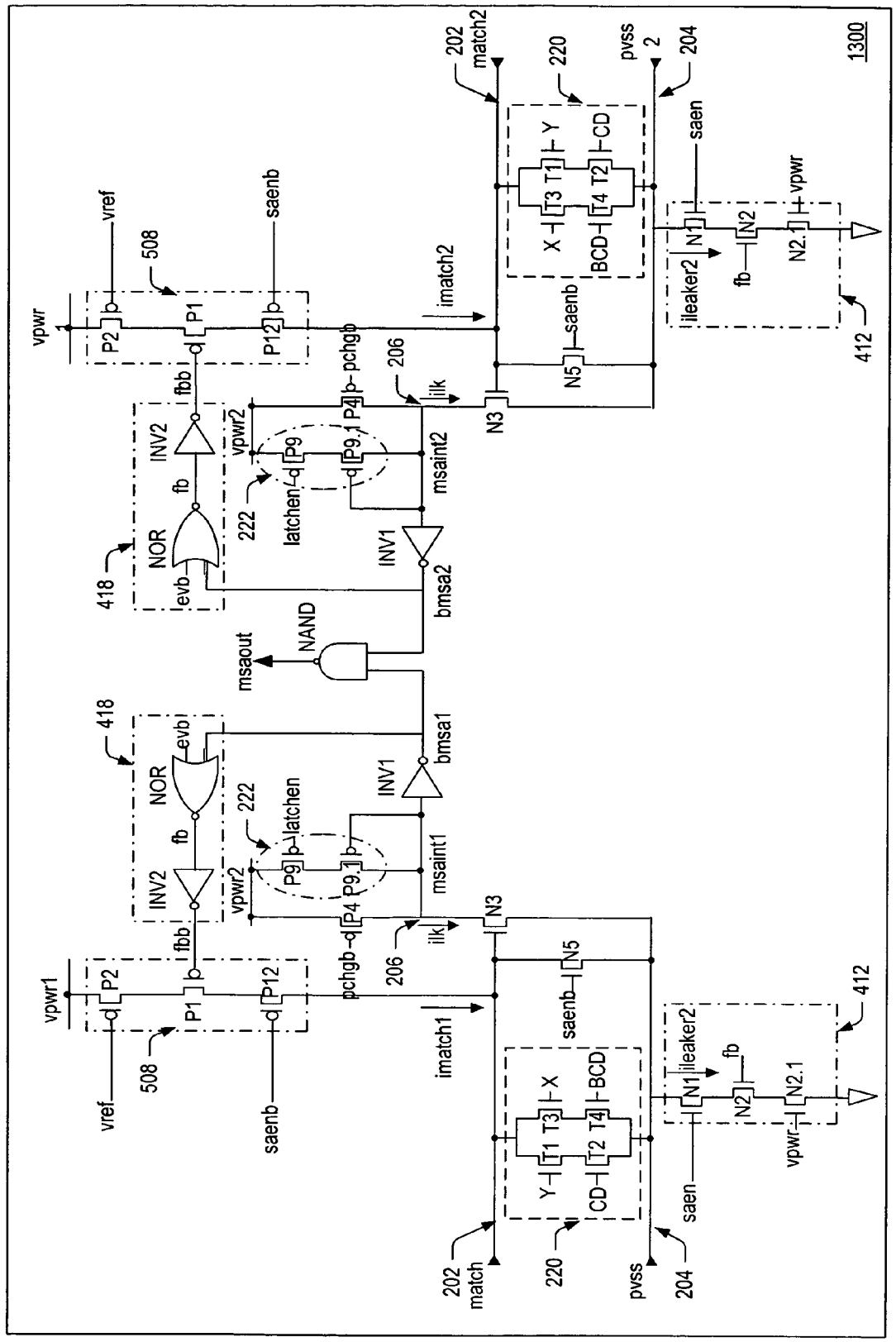
FIG. 13 is a circuit diagram of another sense amplifier circuit, according to a ninth alternative embodiment of the invention.

In the embodiment of FIG. 13, the sense amp circuit shown in FIG. 5 is duplicated to implement a feedback architecture with ½ row detection capabilities. As in FIG. 5, feedback control circuit 418 is used to generate the feedback signals (fbb, fb) supplied to current source switch P1 and current leaker switch N2 for turning on/off the current source and current leaker. An additional NAND gate is used to combine the two intermediate node outputs (bmsa1 and bmsa2). In some cases, the configuration shown in FIG. 13 may be utilized where the search speed is critical. By sensing ½ row, for example, the match and PVSS line capacitance is greatly reduced (40%~50%) and the sensing time during a search operation is reduced linearly. In some cases, the overall search operation speed can be improved by about 25% to 40% (even though the pre-sensing time remains unchanged). However, the power consumption in this scheme is increased because 2 sense amp circuits are used.

FIGS. 14-18 illustrate further embodiments of an improved sense amplifier design with improved insensitivity to fabrication process variations. Like FIGS. 4-13, the sense amplifier designs shown in FIGS. 14-18 eliminate the need for current source trim bits by using a current reference generator to automatically detect and provide the right amount of current to the match line. As such, the embodiments shown in FIGS. 14-18 provide many of the same advantages described above (e.g., simplified layout and reduced die area, back-end testing time and cost). Additional advantages will become apparent in light of the description below.

FIGS. 14-18 provide an alternate means for reducing circuit sensitivities to process variations without utilizing current source trim bits. Many of the circuit elements shown in FIG. 14A are identical to the circuit elements described above in reference to FIG. 5. Like elements are denoted with like reference numerals; the description of which will not be repeated for the purpose of brevity.

In general, sense amplifier 1400 differs from the sense amplifier 500 of FIG. 5 by using a two-system charging scheme. The two-system charging scheme allows faster "HIT" detection by providing the appropriate match line current (Imatch) at a faster rate than previously possible. In sense amplifier 1400, an additional n-channel current source (N15) and p-channel switch (P15) are added to the charging circuit of FIG. 5 to produce charging circuit 1408. The p-channel switch and n-channel current source are coupled in series between the power supply voltage (e.g., Vpwr1) and match line 202, and in parallel with transistors P1, P2 and P12. The additional p-channel switch (P15) is controlled by the complementary sense enable signal (saenb), while the n-channel current source (N15) is controlled by the feedback signal (fb) generated by feedback control circuit 218.

The additional current source (N15) serves as the primary current source by providing about 70% to 80% of the match line current (Imatch) at the beginning of the sensing period. The remaining 20% to 30% of current is provided by a secondary current source, such as the self-tracking and self-adjusting current reference generator (1450) shown in FIG. 14B and described in more detail below.

Figure 14A:
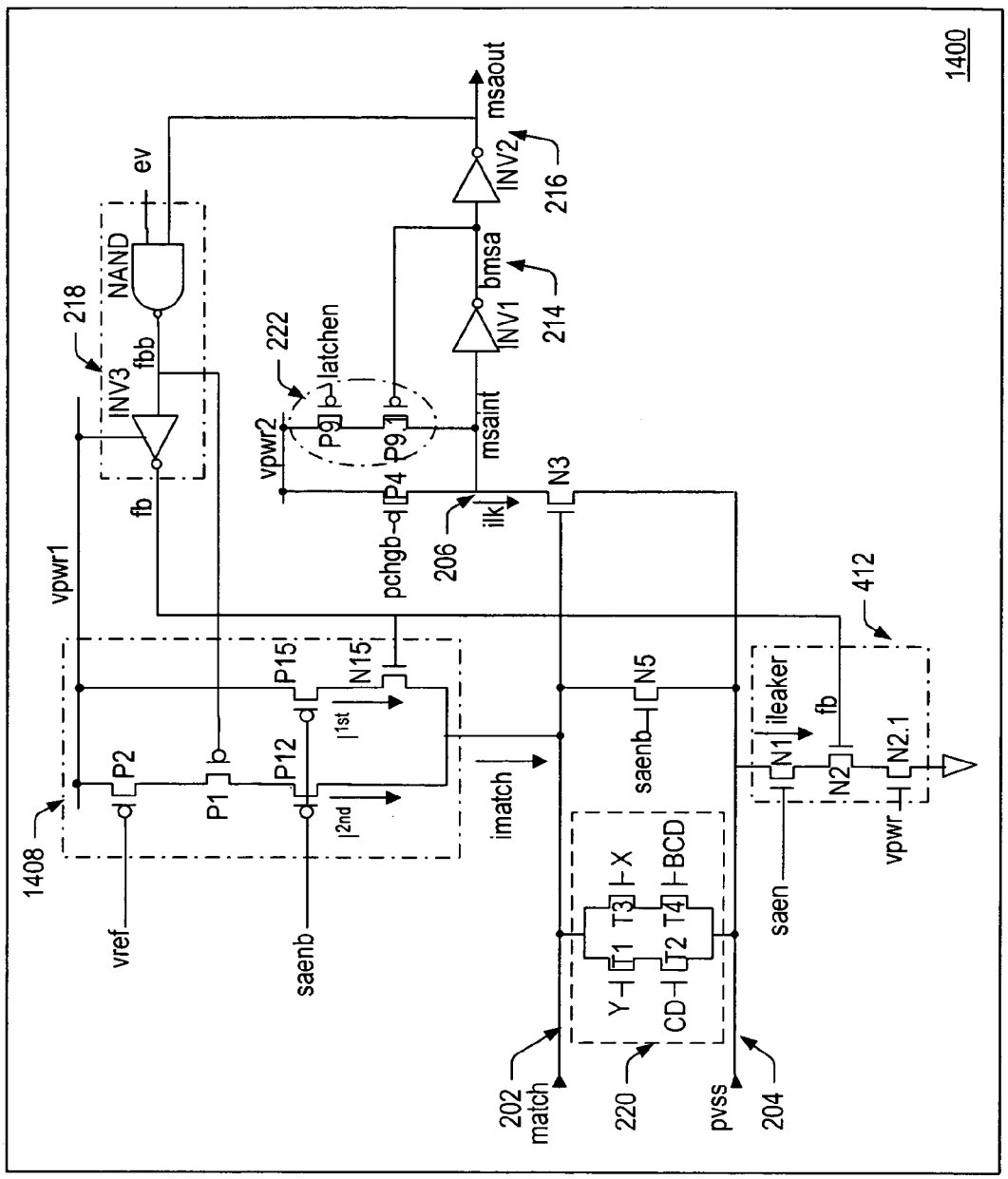
FIG. 14A is a circuit diagram of a sense amplifier circuit coupled for receiving a reference voltage from the reference generator of FIG. 14B, the sense amplifier circuit having reduced power consumption, improved insensitivity to wafer process variations and faster sensing speed, according to a tenth embodiment of the invention.

The two-system charging scheme provides faster "HIT" detection by using an n-channel, rather than p-channel, primary current source. For example, the mobility of an n-channel transistor is nearly twice the mobility of p-channel transistors. Therefore, by using an n-channel current source (N15) and n-channel current leaker (N2, N2.1), the embodiment shown in FIG. 14A is able to pull the match and PVSS lines apart much faster when a "HIT" occurs. However, the fast rising voltage on match line 202 will cause the drain-to-source voltage of current source N15 to drop, which in turn, will cause the match line charging current to drop. At this point, the secondary current source takes over to provide the remaining needed current as the primary current source begins to turn off.

Figure 14B:
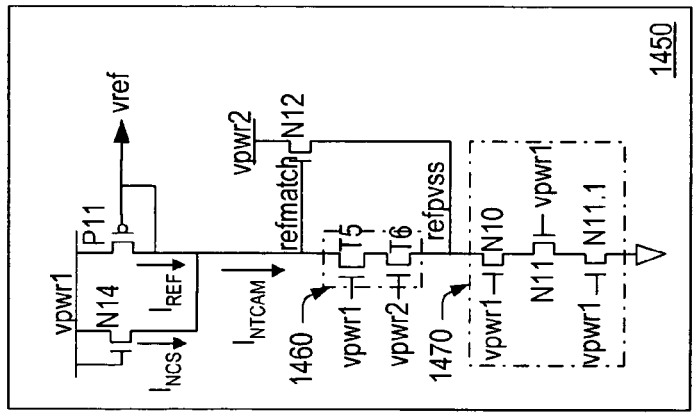
FIG. 14B is a circuit diagram of a current reference generator, according to another embodiment of the invention.

In some cases, current reference generator 1450 of FIG. 14B may be used to provide the remaining 20% to 30% of needed current (i.e., the secondary current) to match line 202. For example, it has been explained above that functional failures can be avoided by supplying an amount of current, which is substantially equal to the drain-to-source current (Ids) through one TCAM compare stack, to the match line during the sensing period. A large portion of this "needed" current is supplied by the fast n-channel current source. However, once the primary current source begins to saturate, the current reference generator (i.e., the secondary current source) is used to automatically detect and provide the remaining portion of the "needed" current. For instance, if the n-channel current source provides only 70% of the total allowed current (through one TCAM compare stack), the reference generator will generate the remaining 30% of the "needed" current.

Similar to the embodiment shown in FIG. 4B, current reference generator 1450 of FIG. 14B includes a p-channel mirror device (P11), a compare stack 1460 (transistors T5/T6), a discharge circuit 1470 (transistors N10, N11 and N11.1), and a sensing device (N12). In addition to the circuit elements described above, current reference generator 1450 also includes an n-channel current source (N14) to mimic the current contribution ($I_{NCS}$) provided by the n-channel current source (N15), which was added to sense amplifier 1400. The $I_{NCS}$ current represents the primary current (i.e., $I^{1st}$), or the largest portion of the maximum amount of current allowed to pass through one TCAM compare stack ($I_{NTCAM}$). The remaining portion of the $I_{NTCAM}$ current is provided by the p-channel reference device P11, which generates a reference current (Iref) substantially equal to ($I_{NTCAM}-I_{NCS}$). In order to generate the appropriate amount of reference current (Iref), all transistors (e.g., P11, T5/T6, N10, N11, N11.1, N12 and N14) within current reference generator 1450 are substantially equal in size to their counterparts (e.g., P2, T1/T2, N1, N2, N2.1, N3 and N15) within sense amplifier 1400. The reference current is then mirrored to charging circuit 1408, via mirror device P2, to provide the secondary current (i.e., $I^{2nd}$) to the match line.

Because the N14 n-channel current source and P11 p-channel current source are both diode connections, the saturation currents provided by both current sources may vary depending on process variation. For a typical process corner, the current contribution from the n-channel and p-channel current sources may be 70% and 30%, respectively. For a skewed process corner (e.g. slow NMOS and fast PMOS), the current contribution from the n-channel and p-channel current sources could be 60% and 40%, respectively. If the skewed corner is fast NMOS and slow PMOS, the current contribution between n-channel and p-channel current sources could be 80% and 20%, respectively.

In the current embodiment, the total amount of current (Imatch) supplied to the match line is equal to $I^{1st}+I^{2nd}$, where $I^{1st}$ is generated by the primary current source (N15) and $I^{2nd}$ is generated by the secondary current source (reference generator 1450). Due to the self-aligned and self-tracking capabilities of reference generator 1450, the total amount of current supplied to match line 202 is guaranteed to pass through any one of the TCAM compare stacks without creating too big of a voltage separation between the match and PVSS lines in a 1-bit MISS case. Therefore, use of the current reference generator eliminates the occurrence of functional failures that may otherwise occur, e.g., when a 1-bit MISS is miss-sensed as a HIT.

In some cases, a distinct current reference generator (1450) may be provided for every M-number of rows in a TCAM array. The generator may be configured to produce a reference current (Iref), which is substantially equal to the drain-source current ($I_{NTCAM}$) through one compare stack in the TCAM array (e.g., T5/T6 which is identical to T1/T2 and T3/T4) minus the current contribution ($I_{NCS}$) from the primary current source. The reference current can then be mirrored to the charging portions of the plurality of sense amplifier circuits associated with the M-number of rows. This ensures that the same match line current (Imatch) will be generated within each of the sense amplifier circuits. Therefore, use of the current reference generator eliminates the occurrence of functional failures that may otherwise occur due to fabrication process variations across different portions of the die. In some cases, power may be saved by using one current reference generator for every M-number of sense amplifiers in the TCAM array (leading to an additional current of $I_{NTCAM}$ for every M-number rows). However, if a current reference generator is used for each sense amplifier circuit, the total MSA current consumption will be doubled in the case of a MISS (i.e., every sense amplifier will consume an amount of current substantially equal to $I_{NTCAM}$+Imatch).

The operation of sense amplifier 1400 will now be described. During the pre-sensing period, the complementary sense amplifier enable signal (saenb) transitions from low to high to equalize the match and PVSS lines (e.g., to a relatively low potential, such as ⅓ VCC) and to disable p-channel switches P12 and P15. At the same time, the sense enable signal (saen) transitions from high to low to disable the NMOS current leaker (N1) within the discharge circuit. The feedback signals (fb, fbb) generated by feedback control circuit 218 are used to enable the p-channel switch (P1) and n-channel current source (N15) within charge circuit 1408, as well as the n-channel current leaker (N2) within discharge circuit 412). In addition, the complementary precharge signal (pchgb) is supplied to the pre-charging device P4 for charging the sense node (msaint) to relatively high potential (e.g., Vpwr2). Once the sense node is charged, the sense amplifier output signal (msaout) will assume a logic high state (i.e., a MISS state) via inverters INV1 and INV2.

As in previous embodiments, the equalization device (N5) shown in FIG. 14A is controlled by the complementary sense amplifier enable signal (saenb), instead of the pre-charge signal (pchg) used in the embodiment of FIG. 2. The advantage of replacing the "pchg" signal with the "saenb" signal is that, in either "HIT" or "MISS" case, the sense amplifier enable signals (saen and saenb) will transition to their opposite states (after a required amount of time to detect a "HIT") to save power. For instance, the complementary sense enable signal (saenb) will transition from low to high to turn on equalization device N5 which, in turn, will equalize the match and PVSS lines to the same voltage potential. The sensing device N3 will also be turned off by a high saenb signal (since Vgs=0V). In the case of a "HIT," the sense node (msaint) will remain at a low voltage potential until a new search cycle starts. In the case of a "MISS," and especially in the case of a 1-bit "MISS," the 0V gate-to-source voltage of sensing device N3 will ensure that any amount of drain-to-source current leakage is cut off, so that the sense node (msaint) will remain at its preset high voltage potential. Therefore, replacing the "pchg" signal with the "saenb" signal further improves the robustness of the sense amplifier design.

During the sensing period, the saenb signal transitions from high to low to turn on p-channel switches P12 and P15. The low saenb signal will also function to turn off equalization device N5. At the same time, the saen and pchgb signals each transition from low to high to enable the NMOS current leaker (N1) and disable the pre-charging device (P4), respectively. This enables the primary current source (N15) and secondary current source (P12) to begin charging match line 202, while the NMOS leaker path begins to discharge PVSS line 204.

In the case of a "HIT," the match line voltage rises and PVSS voltage falls due to the absence of a conducting path between the match to PVSS lines. The primary current source (N15) provides a faster charging current which, in turn, causes a faster voltage separation between match and PVSS lines, which is detected by sensing device N3. Once device N3 turns on, the previously stored (high) charge on the sense node (msaint) will be discharged and the subsequent logic states of INV1 and INV2 will change to output a logic low signal, indicating that a "HIT" has occurred. In the case of a "MISS," one or more conducting paths may exist between the match and PVSS lines. This enables the voltage of the match and PVSS lines to closely track one another at or near the pre-set high level, indicating that a "MISS" has occurred.

A worst case "MISS" detection is observed when only one bit mismatch occurs in a row. For example, the small voltage separation between the corresponding match and PVSS lines may cause sensing device N3 to leak charge (in the subthreshold region), which may cause the sense amplifier to detect a false "HIT" instead of a 1-bit "MISS." Therefore, a weak half latch (P9 and P9.1) may be included, in some embodiments of the invention, to provide additional charge at the sense node to compensate for such leakage.

As one advantage, sense amplifier circuit 1400 provides significantly faster HIT detection speeds by using a two-system charging scheme. In the two-system scheme, an n-channel current source (N15) is used to supply the initial current ($I^{1st}$) needed to quickly charge the match line. Once the n-channel current source saturates, the p-channel secondary current source (P12) continues to provide the remaining portion of the match line current ($I^{2nd}$), such that the total amount of current (Imatch) supplied to the match line is equivalent to the maximum drain-to-source current (Ids) through one TCAM compare stack. Therefore, in addition to automatically compensating for fabrication process variations, the two-system charging scheme described above and shown in FIGS. 14A and B may be used to provide substantially faster search speeds (e.g., up to 26% or more) in CAM devices.

In addition, sense amplifier circuit 1400 eliminates the occurrence of functional failures (due to increased insensitivity to process variations) without the need for costly back-end trimming processes. Without trim bits, the sense amplifier circuit becomes much simpler, the layout is simplified, die area is reduced, and above all, the manufacture and testing time is greatly reduced (decreased time equals decreased cost).

Figure 15:
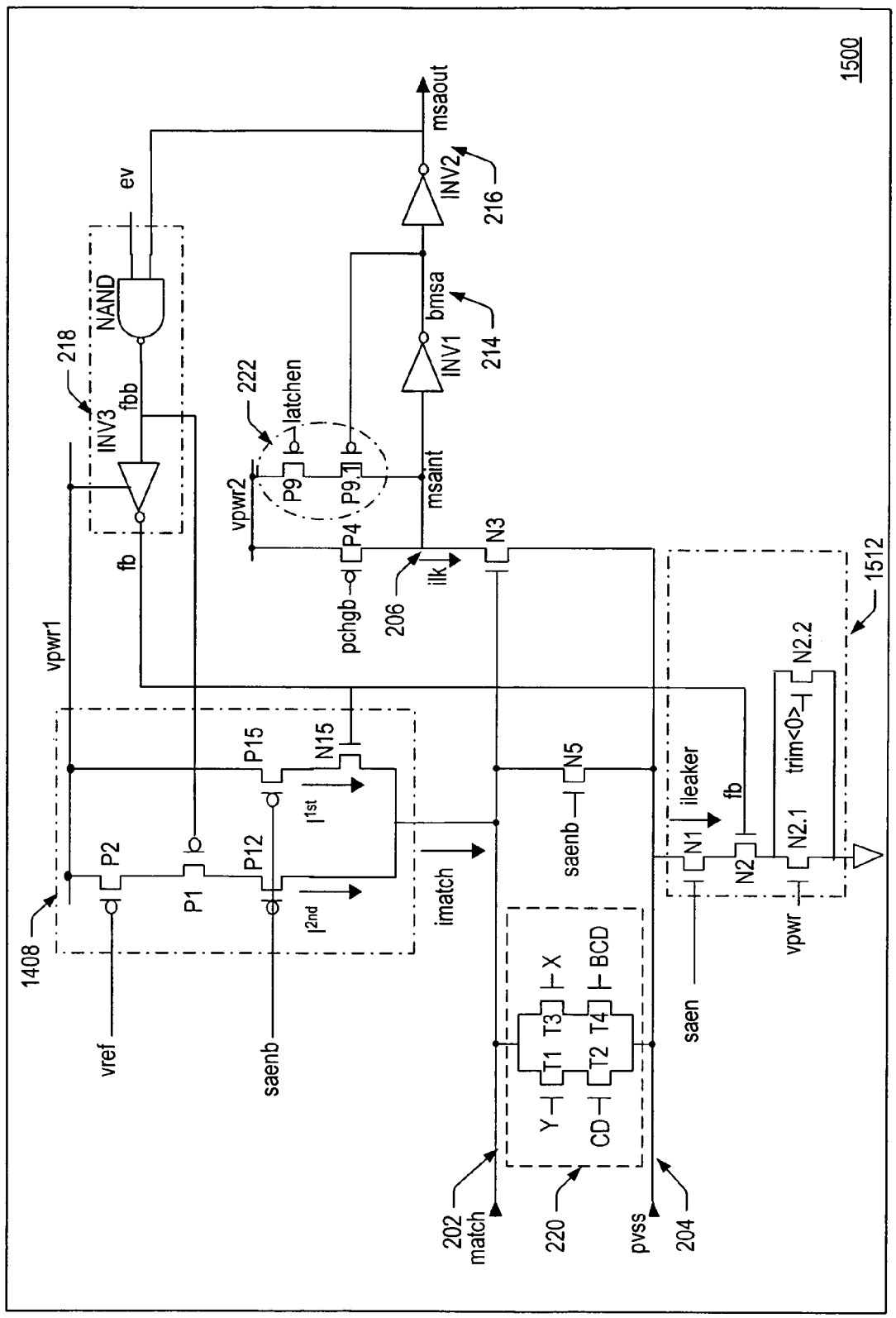
FIG. 15 is a circuit diagram of another sense amplifier circuit, according to an eleventh alternative embodiment of the invention.

FIGS. 15-18 illustrate alternative embodiments of sense amplifier 1400. In FIG. 15, for example, an optional power reduction trim bit (trim <0>) is added to the discharge circuit of FIG. 14A to produce discharge circuit 1512. If trim<0> is set to high, the total leaker current will be very similar to that provided by current leaker 412 of FIG. 14, hence the result will be faster sensing speed. By setting trim<0> to low, the N2.2 discharging path is turned off and the total leaker current is reduced proportionally (e.g., about 50% to 70%). The DC bias point of the match and PVSS line rises to a higher voltage potential causing the drain-to-source voltage of the n-channel and p-channel current sources (N15 and P12) to be smaller, so that less current is provided to the match line. Under this condition, the MISS-to-MISS power consumption is greatly reduced (e.g., up to 21% or more) when compared to FIG. 14, although the total access time might be increased slightly (still has plenty of margin). The advantage of this configuration is that it may be used to improve sensing speed over slower process corners or to reduce power consumption over faster process corners by setting optional trim bit trim<0>.

Figure 16:
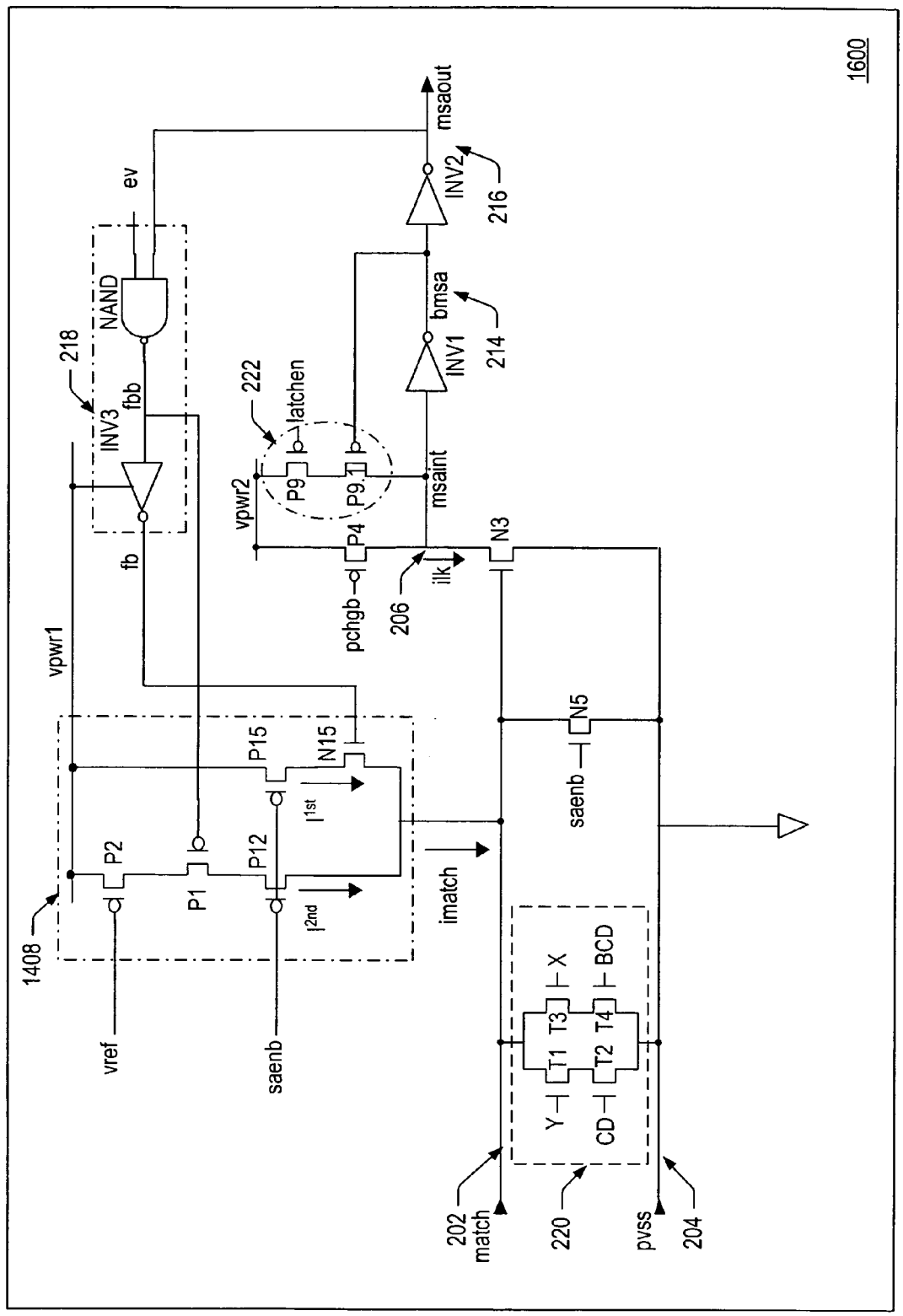
FIG. 16 is a circuit diagram of another sense amplifier circuit, according to a twelfth alternative embodiment of the invention.

In the embodiment of FIG. 16, the discharge circuit is removed and the PVSS line is tied directly to ground in a single-ended sensing scheme. In this configuration, the match and PVSS lines are no longer equalized to 0.3V (the threshold voltage, Vtn, of an n-channel transistor) during the pre-sensing period. Instead, the match line is discharged to 0V. The advantage of this scheme is that it requires smaller headroom (by at least 0.3V). However, the single-ended sensing method of FIG. 16 may be somewhat slower and require more power (since the compare data driver must be swing between 0V and Vpwr2, instead of Vtn to Vpwr2).

Figure 17:
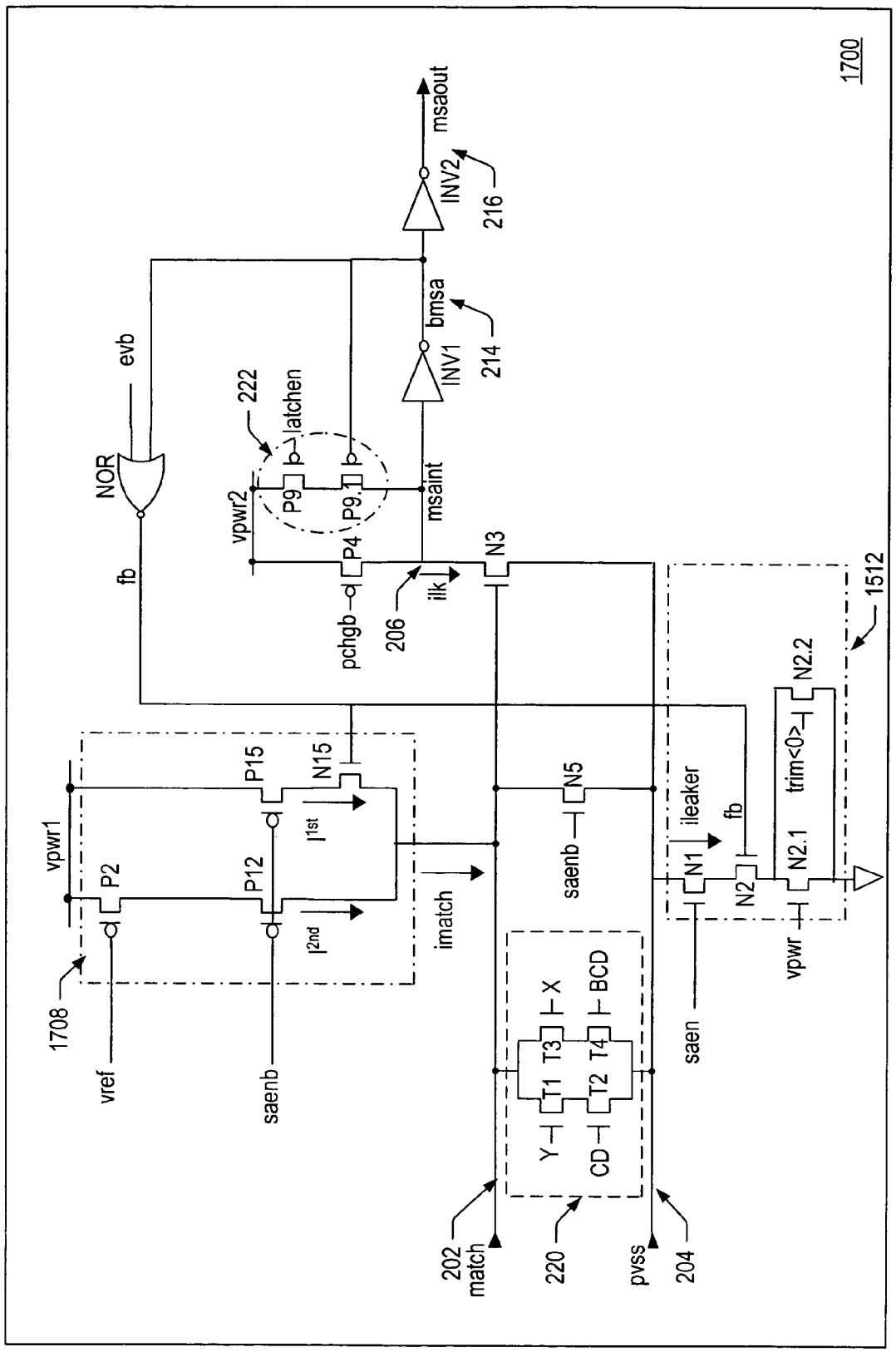
FIG. 17 is a circuit diagram of another sense amplifier circuit, according to a thirteenth alternative embodiment of the invention.

In the embodiment of FIG. 17, a single NOR gate is used in the feedback path, enabling p-channel switch P2 to be removed from charging circuit 1708. The sole feedback signal (fb) generated by the feedback path is supplied to current source N15 and current leaker switch N2. The advantage of this configuration is that it reduces current consumption.

Figure 18:
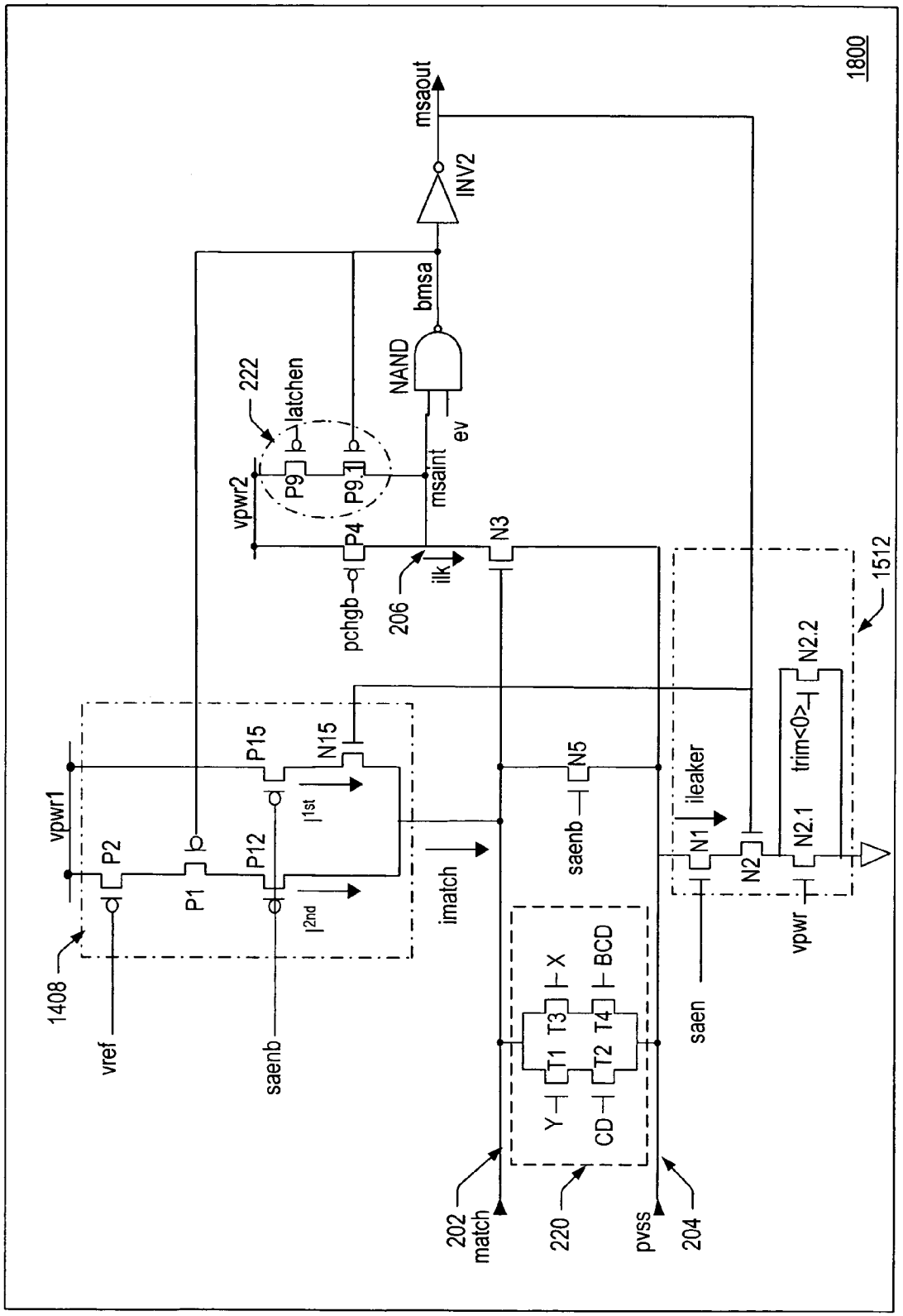
FIG. 18 is a circuit diagram of another sense amplifier circuit, according to a fourteenth alternative embodiment of the invention.
Figure 19:
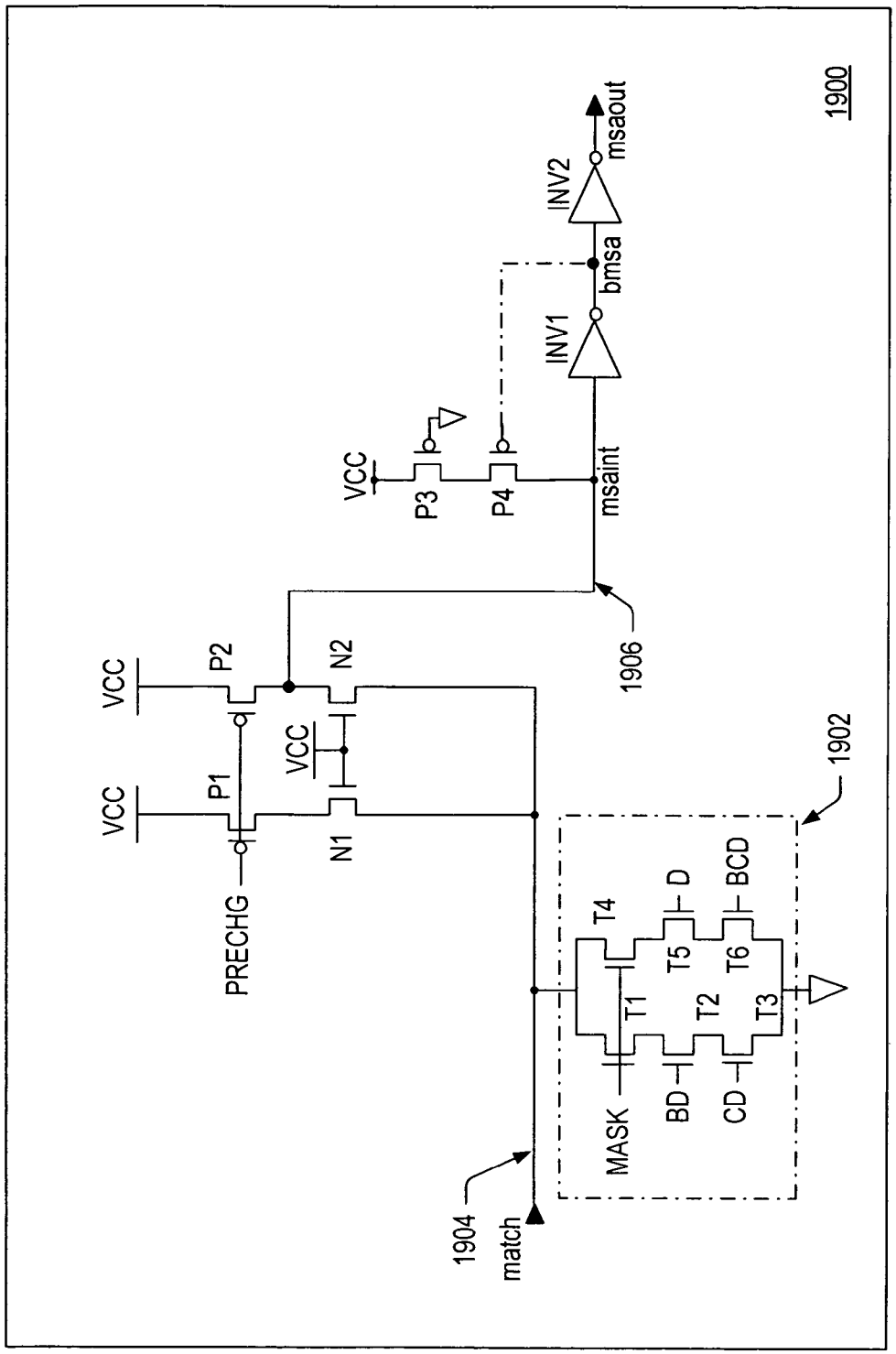
FIG. 19 is a circuit diagram of a conventional sense amplifier circuit.

In the embodiment of FIG. 18, charging circuit 1408 and discharging circuit 1512 are used with a feed forward architecture. In the feed forward architecture, INV1 is replaced by a NAND gate whose inputs are coupled to the sense node (msaint) and the entry valid (ev) control signal. The output of the NAND gate (bmsa) is supplied to INV2, latch transistor P9 and the gate of switching device P1. The sense amplifier output signal (msaout) serves as the feedback control signal for the N2 switch within discharge circuit 1512. In this configuration, power consumption is reduced (by removing the logic gates originally included within the feedback paths) at the cost of sensing speed due to larger gate loading in the output path. In some cases, the lower sensing speed of sense amplifier circuit 1800 may be compensated by increasing the Iref:Imatch current ratio from 1:1 to about 1:1.20 without compromising performance. In some cases, it may be beneficial to set Vpwr1=Vpwr2 when utilizing the feed forward configuration, due to the difficulty in managing the feedback lines when the power supply voltages supplied to the front- and back-ends of the circuit are different.

FIGS. 4-18 illustrate various embodiments of an improved sense amplifier circuit, in accordance with the present invention. However, FIGS. 4-18 are meant to provide only a few examples of an improved sense amp design; alternative embodiments may exist. For example, various embodiments of a sense amplifier with a self-aligned, self-tracking current source are disclosed in a provisional application, which is assigned to the present inventor and entitled "SENSE AMPLIFIER CIRCUIT WITH IMPROVED ACCURACY AND RELIABILITY." In this application, a self-aligned, self-tracking current source (e.g., a single n-channel current source or current mirror) is used to detect and provide just enough current to the match line. Although the embodiments disclosed in the provisional application eliminate functional failures, they tend to do so at the cost of slower sensing speed (due to the fact that smaller charge currents are supplied to the match line once the current source reaches saturation).

The present application improves upon the inventor's previous methods by utilizing two separate current sources. For example, a primary n-channel current source is used to provide an initial amount of current to the match line (e.g., about 60% to 80% of the total charge current). Once match line voltage begins to rise, the primary current source begins to taper off and the secondary current source (provided by the current reference generator) continues to provide the remainder of the current needed. The secondary current source is the one responsible for ensuring that the right amount of charge current is supplied to the match line.

Therefore, the present application provides an additional degree of freedom by utilizing larger amounts of charge current at the beginning of the sensing period (e.g. the larger current can be 2×~3× larger than one compare stack can conduct in a very short time) before the charge current quickly tapers off. This provides faster sensing speed than the embodiments described in the provisional application by not having to wait for the single current source to slowly charge up the match line. In addition to improved sensing speed, functional failures are eliminated by using the secondary current source to provide the remainder of the needed current.

It will be appreciated to those skilled in the art having the benefit of this disclosure that this invention is believed to provide improved sense amplifier designs with faster sensing speeds and increased insensitivities to fabrication process variations. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A memory device, comprising:
   a plurality of memory cells arranged in rows and columns;
   a plurality of sense amplifier circuits each coupled to a different row of memory cells, wherein each sense amplifier circuit is coupled to a match line for receiving a match line voltage and to a low potential line for receiving a low potential voltage from the row of memory cells associated therewith, and wherein the sense amplifier circuit comprises:
      a charging portion, which is coupled between a power supply voltage and the match line;
      a discharging portion, which is coupled between the low potential line and a ground supply voltage; and
      an n-channel sensing device whose gate is coupled to the match line and whose source is coupled to the low potential line for detecting a potential difference between the match line voltage and the low potential voltage; and
   a reference generator coupled to one or more of the sense amplifier circuits for supplying a reference voltage to the charging portion within each of the one or more sense amplifier circuits.

2. The memory device as recited in claim 1, wherein each memory cell within a given row comprises at least one compare stack including a pair of serially-connected n-channel transistors whose drain-to-source path is coupled between the match line and the low potential line.

3. The memory device as recited in claim 2, wherein the memory device is a content addressable memory device.

4. The memory device as recited in claim 3, wherein the charging portion comprises at least two p-channel transistors with source-to-drain paths coupled in series between the power supply voltage and the match line, wherein a first one of the p-channel transistors is a switch activated by an enable signal supplied to the sense amplifier circuits, and wherein the second one of the p-channel transistors is a mirror device coupled for receiving the reference voltage from the reference generator.

5. The memory device as recited in claim 4, wherein the reference generator comprises a duplicate compare stack, a duplicate discharging portion and a duplicate n-channel sensing device, each identically formed and coupled in the same manner as the compare stack, discharging portion and n-channel sensing device included within the sense amplifier circuits.

6. The memory device as recited in claim 5, wherein the reference generator is configured for detecting a maximum amount of current that is able to pass through the drain-to-source path of the pair of serially-connected n-channel transistors within the duplicate compare stack, and for generating a proportional reference voltage in response thereto.

7. The memory device as recited in claim 6, wherein a p-channel reference device within the reference generator is coupled for supplying the reference voltage to the second p-channel transistor within the charging portion, where it is converted into a current to be supplied to the match line, and wherein the converted current is substantially equal to the maximum amount of current detected by the reference generator.

8. The memory device as recited in claim 5, wherein the charging portion further comprises an n-channel current source and a second p-channel switch coupled in series between the power supply voltage and the match line, and in parallel with the serially-connected first and second p-channel transistors.

9. The memory device as recited in claim 8, wherein the reference generator further comprises a duplicate n-channel current source, which is identically formed and coupled in the same manner as the n-channel current source within the charging portion.

10. The memory device as recited in claim 9, wherein the reference generator is configured for detecting the difference between (i) the maximum amount of current that is able to pass through the drain-to-source path of the pair of serially-connected n-channel transistors within the duplicate compare stack and (ii) the amount of current conducted through the duplicate n-channel current source, and wherein the reference generator is further configured for generating the reference voltage in response thereto.

11. The memory device as recited in claim 10, wherein the n-channel current source within the charging portion is configured for supplying a first portion of current to the match line.

12. The memory device as recited in claim 11, wherein a p-channel reference device within the reference generator is coupled for supplying the reference voltage to the second p-channel transistor, where it is converted into a second portion of current to be supplied to the match line, and wherein the converted current is substantially equal to the current difference detected by the reference generator.

13. A sense amplifier circuit associated with a row of memory cells within a memory device, wherein a charging portion of the sense amplifier circuit is coupled for receiving a reference voltage, which is supplied to at least one additional sense amplifier circuit within the memory device, and wherein the sense amplifier circuit is coupled to a match line for receiving a match line voltage and to a low potential line for receiving a low potential voltage, sense amplifier circuit comprising:
  the charging portion, which is coupled between a power supply voltage and the match line;
  a discharging portion, which is coupled between the low potential line and a ground supply voltage; and
  an n-channel sensing device whose gate is coupled to the match line and whose source is coupled to the low potential line for detecting a potential difference between the match line voltage and the low potential voltage.

14. The sense amplifier circuit as recited in claim 13, wherein the charging portion comprises at least two p-channel transistors with source-to-drain paths coupled in series between the power supply voltage and the match line, wherein a first one of the p-channel transistors is a switch coupled for receiving an enable signal, and wherein the second one of the p-channel transistors is a mirror device coupled for receiving the reference voltage.

15. The sense amplifier circuit as recited in claim 14, wherein the reference voltage is proportional to a maximum amount of current that is able to pass through the drain-to-source path of a pair of n-channel transistors, which are coupled in series between the match and low potential lines.

16. The sense amplifier circuit as recited in claim 14, wherein the charging portion further comprises an n-channel current source and a second p-channel switch coupled in series between the power supply voltage and the match line, and in parallel with the first and second p-channel transistors.

17. The sense amplifier circuit as recited in claim 16, wherein the reference voltage is proportional to a difference between (i) the maximum amount of current that is able to pass through the drain-to-source path of a pair of n-channel transistors, which are coupled in series between the match and low potential lines, and (ii) the maximum amount of current that is able to pass through the n-channel current source.

18. A method for operating a sense amplifier circuit, comprising:
  supplying a first amount of charging current to a match line within the sense amplifier circuit;
  detecting a maximum amount of current that can pass through a pair of n-channel transistors coupled in series between the match line and a low potential line within the sense amplifier; and
  supplying a second amount of charging current to the match line, so that the combined first and second amounts of charging current substantially equal the maximum amount of current.

19. The method as recited in claim 18, wherein the step of supplying the first amount of charging current comprises activating an n-channel current source, which is coupled for supplying approximately 60-80% of the maximum amount of current to the match line.

20. The method as recited in claim 19, wherein the step of supplying the second amount of charging current comprises supplying a reference voltage to a p-channel mirror device, which is coupled for supplying approximately 20-40% of the maximum amount of current to the match line.

21. The method as recited in claim 20, wherein the reference voltage is proportional to a difference between (i) the maximum amount of current that can pass through the pair of n-channel transistors and (ii) a maximum amount of current that can pass through the n-channel current source.

22. A memory device, comprising:
  a plurality of memory cells coupled to a match line;
  a sense amplifier circuit coupled to the match line for receiving a match line voltage provided thereon, wherein the sense amplifier circuit comprises a charging portion coupled to the match line; and
  a reference generator coupled to the sense amplifier circuit for controlling an amount of current delivered to the match line via the charging portion in the sense amplifier circuit.

* * * * *